(12) United States Patent
Creazzo et al.

(10) Patent No.: US 10,050,075 B2
(45) Date of Patent: Aug. 14, 2018

(54) MULTI-LAYER EXTRAORDINARY OPTICAL TRANSMISSION FILTER SYSTEMS, DEVICES, AND METHODS

(71) Applicant: Lumilant, Inc., Newark, DE (US)

(72) Inventors: Timothy Creazzo, Newark, DE (US); Mathew Zablocki, Newark, DE (US)

(73) Assignee: LUMILANT, INC., Newark, DE (US)

( * ) Notice: Subject to any disclaimer, the term of this patent is extended or adjusted under 35 U.S.C. 154(b) by 126 days.

(21) Appl. No.: 14/949,734

(22) Filed: Nov. 23, 2015

(65) Prior Publication Data

US 2016/0148963 A1 May 26, 2016

Related U.S. Application Data

(60) Provisional application No. 62/082,705, filed on Nov. 21, 2014.

(51) Int. Cl.
*H01L 27/146* (2006.01)
*G02B 5/28* (2006.01)
*G02B 26/00* (2006.01)

(52) U.S. Cl.
CPC ........ *H01L 27/14627* (2013.01); *G02B 5/284* (2013.01); *G02B 26/001* (2013.01)

(58) Field of Classification Search
CPC .. H01L 27/14627; G02B 26/001; G02B 5/284
See application file for complete search history.

(56) References Cited

U.S. PATENT DOCUMENTS

| | | | |
|---|---|---|---|
| 5,973,316 A | 10/1999 | Ebbesen et al. | |
| 6,040,936 A | * 3/2000 | Kim | G02B 5/008 359/245 |

(Continued)

OTHER PUBLICATIONS

Extraordinary optical transmission through metal films with sub wavelength holes and slits, Arvind S. Vengurlekar, arXiv:1004.0603 [physics.optics], Apr. 5, 2010.*

(Continued)

*Primary Examiner* — Dominic J Bologna
(74) *Attorney, Agent, or Firm* — Muir Patent Law, PLLC

(57) ABSTRACT

Systems, devices, and methods for an extraordinary optical transmission (EOT) image capture system comprising optical components to capture light corresponding to an object, an EOT filter device to receive the captured light and transmit wavelengths of interest, and an image sensor to receive the wavelengths of interest and capture an image corresponding to the object. The EOT filter device comprising a first EOT film with thickness $T_{EOT1}$ and including upper and lower surfaces and a plurality of apertures having a pitch $P_1$, a second EOT film with thickness $T_{EOT2}$ and including upper and lower surfaces and a plurality of apertures having a pitch $P_2$; and an optical cavity disposed between the first and second EOT films, the optical cavity having a thickness $T_{OC}$ and a refractive index $RI_{OC}$, wherein the EOT filter device transmits wavelengths of interest based on thicknesses $T_{EOT1}$ and $T_{EOT2}$, pitches $P_1$ and $P_2$, and thickness $T_{OC}$.

29 Claims, 16 Drawing Sheets

(56) References Cited

U.S. PATENT DOCUMENTS

| | | | | |
|---|---|---|---|---|
| 6,236,033 | B1* | 5/2001 | Ebbesen | B82Y 20/00 250/216 |
| 7,310,153 | B2 | 12/2007 | Kiesel et al. | |
| 7,426,040 | B2 | 9/2008 | Kim et al. | |
| 7,880,251 | B2 | 2/2011 | Wang et al. | |
| 8,009,356 | B1* | 8/2011 | Shaner | G02B 5/008 359/288 |
| 8,111,440 | B2* | 2/2012 | Wang | B82Y 20/00 359/237 |
| 8,462,420 | B2 | 6/2013 | Lee et al. | |
| 8,749,903 | B2 | 6/2014 | Yamada et al. | |
| 8,879,152 | B2 | 11/2014 | Junger et al. | |
| 2007/0258096 | A1* | 11/2007 | Cui | G01N 21/553 356/521 |
| 2012/0309116 | A1* | 12/2012 | Colgan | G01N 29/041 438/5 |
| 2015/0301236 | A1 | 10/2015 | Nakano | |

OTHER PUBLICATIONS

Chen, Lu, Huang, Michael C.Y., Mateus, Carlos F.R., Chang-Hasnain, Connie J., and Suzuki, Y., "Fabrication and design of an integrable subwavelength ultrabroadband dielectric mirror," Applied Physics Letters, vol. 88, No. 031102, American Institute of Physics (AIP) Publishing, pp. 1-3 (2006).

Cleary, Justin W., Nader Esfahani, Nima, Vangala, Shivashankar, Guo, Junpeng, Hendrickson, Joshua R., Leedy, Kevin D., Thomson, Darren, and Look, David C., "Long-wavelength infrared surface plasmons on Ga-doped ZnO films excited via 2D hole arrays for extraordinary optical transmission," Plasmonics: Metallic Nanostructures and Their Optical Properties XI, Proceedings of SPIE, vol. 8809, pp. 1-8 (2013).

Daly, James T., Bodkinh, Andrew, Schnellerc, William, Kerrc, Robert, Notoc, John, Haren, Raymond, Eismann, Michael, and Karch, Barry, "Tunable Narrow-Band Filter for LWIR Hyperspectral Imaging," In Photodetectors: Materials and Devices V, Proceedings of SPIE, vol. 3948, pp. 104-114 (2000).

Ding, Y., and Magnusson, R., "Resonant leaky-mode spectral-band engineering and device applications," Optics Express, vol. 12, No. 23, Optics Society of America, pp. 5661-5674 (Nov. 15, 2004).

Ding, Y., and Magnusson, R., "Use of nondegenerate resonant leaky modes to fashion diverse optical spectra," Optics Express, vol. 12, No. 9, Optics Society of America, pp. 1885-1891 (May 3, 2004).

Ebbesen, T. W., Lezec, H. J., Ghaemi, H. F., Thio, T., and Wolff, P. A., "Extraordinary optical transmission through sub-wavelength hole arrays," Nature, vol. 391, Macmillan Publishers, Ltd, pp. 667-669 (Feb. 12, 1998).

Genet, C., and Ebbesen, T. W., "Light in tiny holes," Nature, vol. 445, Macmillan Publishers, Ltd, pp. 39-46 (Jan. 4, 2007).

Gittins, Christopher M., Lawrence, William G., and Marinelli, William J., "Frequency-agile bandpass filter for direct detection lidar receivers," Applied Optics, vol. 37, No. 36, The Optical Society, pp. 8327-8335 (Dec. 20, 1998).

Inoue, Daisuke, Miura, Atsushi, Nomura, Tsuyoshi, Fujikawa, Hisayoshi, Sato, Kazuo, Ikeda, Naoki, Tsuya, Daiju, Sugimoto, Yoshimasa, and Koide, Yasuo, "Polarization independent visible color filter comprising an aluminum film with surface-plasmon enhanced transmission through a subwavelength array of holes," Applied Physics Letters, vol. 98, 093113, American Institute of Physics (AIP) Publishing, pp. 1-4 (Mar. 2, 2011).

Knudtson, J. Thomas, Levy, David S., and Herr, Kenneth C., "Electronically tunable, first-order Fabry-Perot infrared filter," Optical Engineering, vol. 35, No. 8, Society of Photo-Optical Instrumentation Engineers, pp. 2313-2320 (Aug. 1996).

Magnusson, R. and Wang, S. S., "Transmission bandpass guided-mode resonance filters," Applied Optics, vol. 34, No. 35, The Optical Society, pp. 8106-8109 (Dec. 10, 1995).

Mao, H., Silva, K. K. M. B. D., Martyniuk, M., Antoszewski, J., Bumgarner, J., and Faraone, L., "Towards longwave infrared tune-able filters for multispectral thermal imaging applications," School of Electrical, Electronics and Computer Engineering, The University of Western Australia, 35 Stirling Highway, Crawley 6009, Western Australia, 6 pages (publication date unknown).

Marinelli, William J., Gittins, Christopher M., Gelb, Alan H., and Green, B. David, "Tunable Fabry—Perot etalon-based long-wavelength infrared imaging spectroradiometer," Applied Optics, vol. 38, No. 12, The Optical Society, pp. 2594-2604 (Apr. 20, 1999).

Mateus, Carlos F. R., Huang, Michael C. Y., Chen, Lu, Chang-Hasnain, Connie J., and Suzuki, Yuri, "Broad-Band Mirror (1.12-1.62 μm) Using a Subwavelength Grating," IEEE Photonics Technology Letters, vol. 16, No. 7, IEEE, pp. 1676-1678 (Jul. 2004).

Mateus, Carlos F. R., Huang, Michael C. Y., Deng, Yunfei, Neureuther, Andrew R., and Chang-Hasnain, Connie J., "Ultrabroadband Mirror Using Low-Index Cladded Subwavelength Grating," IEEE Photonics Technology Letters, vol. 16, No. 2, IEEE, pp. 518-520 (Feb. 2004).

Navarro-Cia, Miguel, Beruete, Miguel, and Sorolla, Mario, "Electromagnetic Response of Extraordinary Transmission Plates Inspired on Babinet's Principle," Behaviour of Electromagnetic Waves in Different Media and Structures, Intech, www.intechopen.com, pp. 325-352 (Jun. 9, 2011) (available at http://www.intechopen.com/books/behavior-of-electromagnetic-waves-in-different-media-and-structures/electromagnetic-response-of-extraordinary-transmission-plates-inspired-on-babinet-s-principle1).

Nye, Nicholas S., Dimitriadis, Alexandros I., Kantartzi, Nikolaos V., and Tsiboukis, Theodoros D., "Enhanced Design of Narrowband Filters Based on the Extraordinary Transmission Through Single Fishnet Structures," Progress in Electromagnetics Research, vol. 143, pp. 349-368 (Nov. 2013).

Ortuno, R., Garcia-Meca, C., Rodriguez-Fortuno, F. J., and Martinez, A., "Extraordinary Transmission and Light Confinement in Subwavelength Metallic Films Apertures," Progress in Electromagnetics Research Symposium (PIERS) Proceedings, Marrakesh, Morocco, pp. 22-26 (Mar. 20-23, 2011).

Ortuno, R., Garcia-Meca, C., Rodriguez-Fortuno, F. J., Hakansson, A., Griol, A., Hurtado, J., Ayucar, J.A., Lopez-Royo, F., Marti, J., and Martinez, A., "Midinfrared filters based on extraordinary optical transmission through subwavelength structured gold films," Journal of Applied Physics, vol. 106, No. 124313, American Institute of Physics (AIP) Publishing, pp. 1-6 (2009).

Porto, J. A., Garcia-Vidal, F. J., and Pendry, J. B., "Transmission Resonances on Metallic Gratings with Very Narrow Slits," Physical Review Letters, vol. 83, No. 14, The American Physical Society, pp. 2845-2848 (Oct. 4, 1999).

Shin, Dongho, Tibuleac, Sorin, Maldonado, Theresa A., and Magnusson, Robert, "Thin-film optical filters with diffractive elements and waveguides," Optical Engineering, vol. 37, No. 9, Society of Photo-Optical Instrumentation Engineers, pp. 2634-2646 (Sep. 1998).

Sun, Zhijun, Yang, Ying, and Zuo, Xiaoliu, "Narrow-band optical transmission of metallic nanoslit arrays," Applied Physics Letters, vol. 101, No. 171106, American Institute of Physics (AIP) Publishing, pp. 1-4 (2012).

Sun, Zhijun, and Lin, Qi, "Study of a Fabry—Pérot-Like Microcavity With Sandwiched Metallic Gratings for Tunable Filter Arrays," IEEE Photonics Technology Letters, vol. 20, No. 13, pp. 1157-1159 (Jul. 1, 2008).

Tibuleac, Sorin, Magnusson, Robert, Maldonado, Theresa A., Young, Preston P., and Holzheimer, Timothy R., "Dielectric Frequency-Selective Structures Incorporating Waveguide Gratings," IEEE Transactions on Microwave Theory and Techniques, vol. 48, No. 4, IEEE, pp. 553-561 (Apr. 2000).

Tibuleac, Sorin, and Magnusson, Robert, "Narrow-linewidth bandpass filters with diffractive thin-film layers," Optics Letters, vol. 26, No. 9, The Optical Society, pp. 584-586 (May 1, 2001).

Tibuleac, Sorin, and Magnusson, Robert, "Reflection and transmission guided-mode resonance filters," Journal of the Optical Society of America A, vol. 14, No. 7, The Optical Society, pp. 1617-1626 (Jul. 1997).

Tuohiniemi, M., Blomberg, M., Akujarvi, A., Antila, J., and Saari, H., "Optical transmission performance of a surface-micromachined

(56) References Cited

OTHER PUBLICATIONS

Fabry—Perot interferometer for thermal infrared," Journal of Micromechanics and Microengineering, vol. 22, No. 115004, IOP Publishing, pp. 1-7 (2012).
Yue, Weisheng, Wang, Zhihong, Yang, Yang, Li Jinqqi, Wu, Ying, Chen, Longqing, Ooi, Boon, Wang, Xianbin, and Zhang, Xi-xiang, "Enhanced extraordinary optical transmission (EOT) through arrays of bridged nanohole pairs and their sensing applications," Nanoscale, vol. 6, The Royal Society of Chemistry, pp. 7917-7923 (May 8, 2014).

* cited by examiner

MULTI-LAYER EXTRAORDINARY OPTICAL TRANSMISSION FILTER SYSTEMS, DEVICES, AND METHODS

CROSS-REFERENCE TO RELATED APPLICATION

This application claims the benefit of priority under 35 U.S.C. § 119 to U.S. Provisional Application No. 62/082,705, filed Nov. 21, 2014, in the United States Patent and Trademark Office, the entire contents of which is hereby incorporated by reference.

BACKGROUND

Field

This disclosure relates to extraordinary optical transmission filter devices, systems, and related methods of manufacture.

Background

Currently, patterned films use Extraordinary Optical Transmission (EOT) techniques to achieve optical transmission through films that might otherwise be opaque. EOT films may utilize subwavelength features patterned in a metal film to allow for transmission of optical wavelengths that are resonant with the subwavelength patterned features. Typically, EOT films have a narrow bandpass response where optical wavelengths are resonant with the subwavelength patterned features. In addition, many traditional EOT devices are engineered to transmit a specific spectral range but are not tunable to change the range of frequency of light that is transmitted therethrough. In addition, to transmit an optical narrowband using traditional EOT filters, the EOT layer is required to be somewhat thick. Traditional EOT materials may be limited because they are opaque to light in the absence of precise slots. Further, traditional optical filters may require stacks of alternating high-index/low-index films. However, patterning a thick layer with accurate size and spacing of subwavelength features is difficult to manufacture.

SUMMARY

In some exemplary embodiments, the present disclosure is directed to an extraordinary optical transmission (EOT) imaging system comprising: one or more lenses; an EOT filter device configured to receive light from the one or more lenses, the EOT filter device comprising: a first EOT film having a first EOT film thickness $T_{EOT1}$, the first EOT film including: a first upper surface, a first lower surface, and a plurality of first apertures having a first aperture width smaller than wavelengths of the light received from the one or more lenses, the first apertures spaced at a first pitch $P_1$ such that the first EOT film is configured to transmit via extraordinary optical transmission a portion of the light received from the one or more lenses that falls within a first frequency bandwidth and substantially prevent transmission of a second portion of the light received from the one or more lenses that falls outside the first frequency bandwidth; a second EOT film having a second EOT film thickness $T_{EOT2}$, the second EOT film including: a second upper surface, a second lower surface, and a plurality of second apertures having a second aperture width smaller than the wavelengths of the light received from the one or more lenses, the second apertures spaced at a second pitch $P_2$; and wherein the first and second EOT films form an optical cavity having a thickness $T_{OC}$, which is measured from the first lower surface to the second upper surface, and a refractive index $RI_{OC}$, wherein an optical path length of light through the optical cavity is a function of the optical cavity thickness $T_{OC}$ and the refractive index $RI_{OC}$, wherein the optical cavity is configured to cause destructive interference of the first portion of the light transmitted through the first EOT film so that only a part of the first portion of the light is transmitted through the second EOT film, the part of the first portion of the light transmitted through the second EOT film having a second frequency bandwidth within and less than the first frequency bandwidth; and an image sensor configured to receive and sense the part of the first portion of the light transmitted through the second EOT film to capture an image corresponding to the light received from the one or more lenses.

In some exemplary embodiments, the present disclosure is directed to an extraordinary optical transmission (EOT) imaging system comprising: optical components configured to capture wavelengths of light corresponding to an object; an EOT filter device configured to receive the light captured by the optical components and transmit wavelengths of interest, the EOT filter device comprising: a first EOT film having a first EOT film thickness $T_{EOT1}$ and including a plurality of first apertures having a first pitch $P_1$; a second EOT film having a second EOT film thickness $T_{EOT2}$ and including a plurality of second apertures having a second pitch $P_2$; and an optical cavity disposed between the first EOT film and the second EOT film, the optical cavity having a thickness $T_{OC}$ and a refractive index $RI_{OC}$, wherein an optical path length of light through the optical cavity is a function of the optical cavity thickness $T_{OC}$ and the refractive index $RI_{OC}$, wherein the EOT filter device transmits the wavelengths of interest based on the first EOT film thickness $T_{EOT1}$, the second EOT film thickness $T_{EOT2}$, the first pitch $P_1$, the second pitch $P_2$, and the optical cavity thickness $T_{OC}$; and an image sensor configured to receive the wavelengths of interest from the EOT filter device and capture an image corresponding to the object.

In some aspects, the disclosure further includes wherein the plurality of first apertures have a first aperture width, and the first pitch $P_1$ and the first aperture width are smaller than the wavelengths of the light received from the optical components.

In some aspects, the disclosure further includes wherein the first EOT film is configured to transmit via extraordinary optical transmission a portion of the light received from the optical components that falls within a first frequency bandwidth and substantially prevent transmission of a second portion of the light received from the optical components that falls outside the first frequency bandwidth.

In some aspects, the disclosure further includes wherein the optical cavity is configured to cause destructive interference of the first portion of the light transmitted through the first EOT film so that only a part of the first portion of the light is transmitted through the second EOT film, and the part of the first portion of light transmitted through the second EOT film has a frequency bandwidth within and less than the first frequency bandwidth.

In some aspects, the disclosure further includes wherein the image sensor is further configured to receive and sense the part of the first portion of light transmitted through the second EOT film to capture an image corresponding to the object.

In some aspects, the disclosure further includes wherein the first EOT film further comprises a first upper surface and a first lower surface, the second EOT film further comprises a second upper surface and a second lower surface, and the optical cavity thickness $T_{OC}$ is measured from the first lower surface to the second upper surface.

In some aspects, the disclosure further includes a first buffer layer formed between the first EOT film and the optical cavity; and a second buffer layer formed between the second EOT film and the optical cavity.

In some aspects, the disclosure further includes wherein the first EOT film and the second EOT film are comprised of a semiconductor.

In some aspects, the disclosure further includes wherein the first EOT film and the second EOT film are comprised of a metal.

In some aspects, the disclosure further includes wherein the optical components include one or more lenses.

In some exemplary embodiments, the present disclosure is directed to an extraordinary optical transmission (EOT) imaging system comprising: one or more lenses configured to capture light corresponding to an object; an EOT filter device configured to receive the light captured by the one or more lenses, the EOT filter device comprising: a first EOT film having a first EOT film thickness $T_{EOT1}$, the first EOT film including: a first upper surface, a first lower surface, and a plurality of first apertures having a first pitch $P_1$ and a first aperture width; a second EOT film having a second EOT film thickness $T_{EOT2}$, the second EOT film including: a second upper surface, a second lower surface, and a plurality of second apertures having a second pitch $P_2$ and a second aperture width; and an optical cavity disposed between the first EOT film and the second EOT film, the optical cavity having a thickness $T_{OC}$, which is measured from the first lower surface to the second upper surface, wherein the EOT filter device uses surface plasmon resonance to allow wavelengths of interest to pass through based on the first EOT film thickness $T_{EOT1}$, the second EOT film thickness $T_{EOT2}$, the first pitch $P_1$, the second pitch $P_2$, the first aperture width, and the second aperture width; and an image sensor configured to capture an image corresponding to the object based on the wavelengths of interest received from the EOT filter device.

In some aspects, the disclosure further includes the optical cavity further having a refractive index $RI_{OC}$, wherein an optical path length of light through the optical cavity is a function of the optical cavity thickness $T_{OC}$ and the refractive index $RI_{OC}$.

In some aspects, the disclosure further includes a plurality of actuators, wherein the plurality of actuators are configured to change the wavelengths of interest by changing the optical path length of the light.

In some aspects, the disclosure further includes wherein the plurality of actuators change the wavelengths of interest by changing the optical cavity thickness $T_{OC}$.

In some aspects, the disclosure further includes wherein the optical cavity thickness $T_{OC}$ is measured from the first lower surface to the second upper surface.

In some aspects, the disclosure further includes a first buffer layer formed between the first EOT film and the optical cavity; and a second buffer layer formed between the second EOT film and the optical cavity.

In some aspects, the disclosure further includes wherein the first EOT film and the second EOT film are comprised of a semiconductor.

In some aspects, the disclosure further includes wherein the first EOT film and the second EOT film are comprised of a metal.

In some aspects, the disclosure further includes wherein the first EOT film is configured to transmit via extraordinary optical transmission a portion of the light received from the one or more lenses that falls within a first frequency bandwidth and substantially prevent transmission of a second portion of the light received from the one or more lenses that falls outside the first frequency bandwidth.

BRIEF DESCRIPTION OF THE DRAWINGS

The above and other objects and features will become apparent from the following description with reference to the following figures, wherein like reference numerals refer to like parts throughout the various figures unless otherwise specified. The drawings are not necessarily to scale, emphasis instead being placed upon illustrating the principles of the disclosed embodiments. In the drawings.

DETAILED DESCRIPTION

Figure 1A:
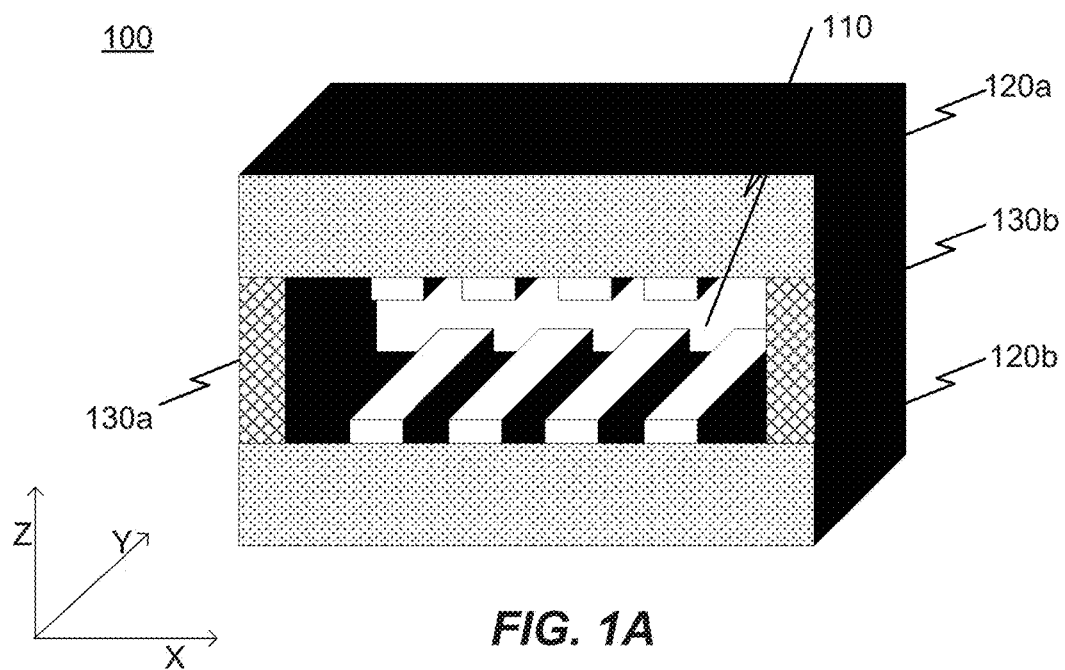
FIG. 1A is a cut-out diagram illustrating an exemplary tunable extraordinary optical transmission (EOT) filter device, according to certain disclosed embodiments.

Various exemplary embodiments will be described in detail with reference to the accompanying drawings. The disclosed concepts, however, may be embodied in various different forms, and should not be construed as being limited only to the illustrated embodiments. Accordingly, known processes, elements, and techniques are not described with respect to some of the embodiments of the disclosure. Unless otherwise noted, like reference numerals denote like elements throughout the attached drawings and written description, and thus descriptions will not be repeated. In the drawings, the sizes and relative sizes of layers and regions may be exaggerated for clarity.

The exemplary embodiments will be described with reference to cross-sectional views and/or plan views by way of ideal schematic views. Thicknesses of layers and areas are exaggerated for effective description of the technical contents in the drawings. Forms of the embodiments may be modified by the manufacturing technology and/or tolerance. Therefore, the disclosed embodiments are not intended to be limited to illustrated specific forms, and may include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the disclosed embodiments.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

Spatially relative terms, such as "beneath," "below," "lower," "under," "above," "upper," and the like, may be used herein for ease of description to describe one element's or feature's relationship to another element(s) or feature(s) as illustrated in the figures. It will be understood that spatially relative terms are intended to encompass different orientations of the device in use or operation in addition to the orientation depicted in the figures. For example, if the device in the figures is turned over, elements described as "below," "beneath," or "under" another/other element(s) or feature(s) would then be oriented "above" or "on top of" the another/other element(s) or feature(s). Thus, the exemplary terms "below," "beneath," and "under" can encompass both an orientation of above and below. The device may be otherwise oriented (rotated 90 degrees or at other orientations) and the spatially relative descriptors used herein may be interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" or as "contacting" another element or layer, there are no intervening elements or layers present.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to typical deviations in manufacturing processes. The term "substantially" may be used herein to reflect this meaning.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements, components, and/or groups, but do not preclude the presence or addition of one or more other features, regions, integers, steps, operations, elements, components, and/or groups thereof. In addition, unless the context indicates otherwise, steps described in a particular order need not occur in that order. As used herein, the term "and/or" includes any and all combinations of one or more of the associated listed items.

As will be understood, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood, all language such as "up to," "at least," "greater than," "less than," and the like include the number recited and refer to ranges which can be subsequently broken down into subranges as discussed above. Finally, as will be understood, a range includes each individual member. Thus, for example, a group having 1-3 members refers to groups having 1, 2, or 3 members. Similarly, a group having 1-5 members refers to groups having 1, 2, 3, 4, or 5 members, and so forth.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein. As used herein, the term "narrowband" transmission may refer to transmissions over a range of wavelengths that are less than 20% of the total range of interest. For example, the narrowband transmission value for the spectral range between 1 and 3 μm may be 0.2 μm or less. In addition, the terms "media" and "medium" may refer to a particular solid, liquid, or gas, or material (e.g., Al, ZnSe, Si, etc.) or categories of material (e.g., metals, semiconductors, dielectrics, etc.). Further, the term "targeted wavelengths $\lambda_{target}$" may refer to one or more wavelengths of light or bands of wavelengths of light that are targeted for transmission through the exemplary embodiments. As used herein, the terms "transmission," "transmit," "transmitted," and "pass," when referring to the light applied to the exemplary EOT filters and filter devices, refers to the transfer of light energy through the EOT filter and filter devices including light transmitted via an extraordinary optical transmission phenomenon. It will be understood to one of skill in the art that the discussion of wavelengths and ranges of wavelengths of light, as used herein, are applicable to the corresponding frequency/frequencies of that light. For ease of description, much of the discussion focuses on wavelengths, and it is inherent that any discussions of wavelengths in the embodiments disclosed and illustrated herein applies to the corresponding frequencies.

The present disclosure relates to optical band-pass filters, which may include multiple layers of extraordinary optical transmission (EOT) films to form one or more resonant optical cavities. The disclosed embodiments may be used, for example, in hyperspectral imaging (HSI) systems to achieve faster and improved identification of objects within a scene through simultaneous capture of spatial and spectral information of the scene. Generally, HSI imaging collects and processes information from across the electromagnetic spectrum to obtain the spectrum for each pixel in the image of a scene for the purpose of finding objects, identifying materials, or detecting processes.

In the disclosed embodiments, as a spectrally-broad optical signal passes through the layered filter structure, targeted wavelength of light $\lambda_{target}$ may be transmitted, while other wavelengths may be blocked from transmission. A higher transmission efficiency of targeted wavelengths $\lambda_{target}$ may be realized through, for example, the phenomena of surface plasmons and constructive interference. Surface plasmons may comprise electron oscillations, or waves, propagating along the surface of a film when the film is excited by an external electric field such as, for example, incident light. When the surface plasmon wave interacts with an irregularity, such as a patterned surface, the patterned surface or periodic surface structures allow the surface plasmons to "couple" with the incident light, and allow the light energy to pass through the film. Thus, part of the energy can be re-emitted as light as it exits the filter. Surface plasmon resonance may occur when the frequency of incident light applied to the surface of the material matches the natural frequency of the surface electron oscillations. Constructive interference may occur when two or more propagating waves having the same frequency are at their maximum magnitudes at the same point.

To achieve the disclosed embodiments, metamaterial-based frequency selective films or materials may be used. Metamaterials may be engineered materials having subwavelength features that can be manipulated to demonstrate atypical electromagnetic behavior. Generally, the term "subwavelength features" may describe features having one or more dimensions smaller than the targeted wavelengths $\lambda_{target}$. For example, metamaterials may include thin metal films or low loss semiconductor thin films with subwavelength apertures or gratings (SWG).

The disclosed embodiments provide for reflective EOT films (such as metal or semiconductor EOT films) to create one or more resonant optical cavities. The disclosed embodiments allow for monolithic integration of optical filter that use films (e.g., metal or semiconductor films) having SWG structures. In embodiments using EOT metallic films, high fill factor gratings may allow the EOT films to be utilized as mirrors to form a resonant optical cavity to produce an optical filter.

Figure 1B:
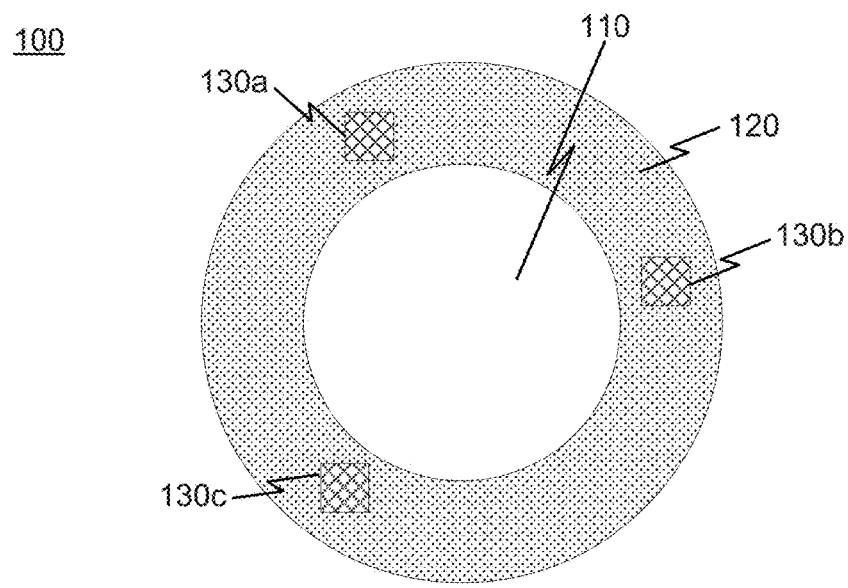
FIG. 1B is a top-view diagram illustrating the exemplary EOT filter device of FIG. 1A, according to certain disclosed embodiments.

FIG. 1A illustrates a perspective view of an exemplary extraordinary optical transmission (EOT) filter device 100. FIG. 1B illustrates a top-down view of an exemplary EOT device, such as EOT filter device 100 of FIG. 1A. Although FIG. 1A illustrates EOT filter device 100 having a square or rectangular shape, EOT filter device 100 may have a round shape, as illustrated in FIG. 1B. As shown in FIGS. 1A and 1B, an example EOT filter device 100 may comprise tunable EOT filter 110, one or more optical windows 120 (e.g., optical windows 120a and 120b of FIG. 1A), and one or more actuators 130 (e.g., actuators 130a and 130b of FIG. 1A, and actuators 130a, 130b, and 130c of FIG. 1B).

Figure 1C:
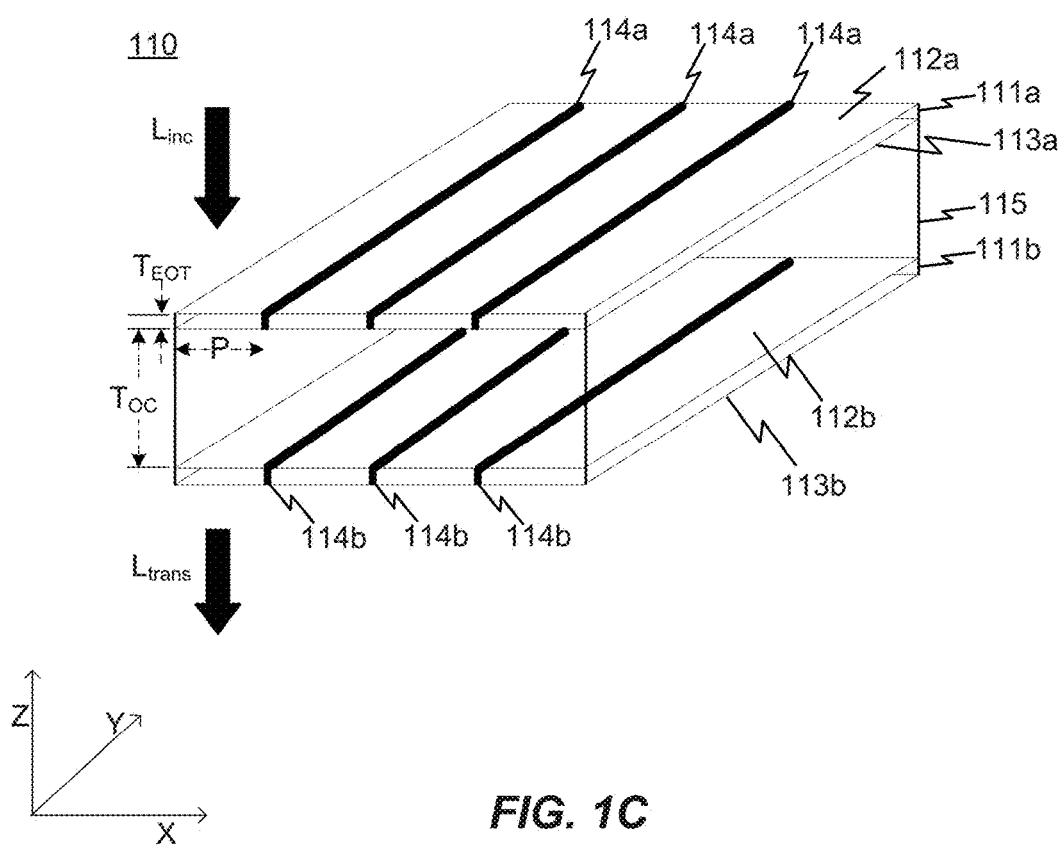
FIGS. 1C-1E are cut-out diagrams illustrating an exemplary tunable EOT filter included in the EOT filter device of FIGS. 1A and 1B, according to certain disclosed embodiments.
Figure 1D:
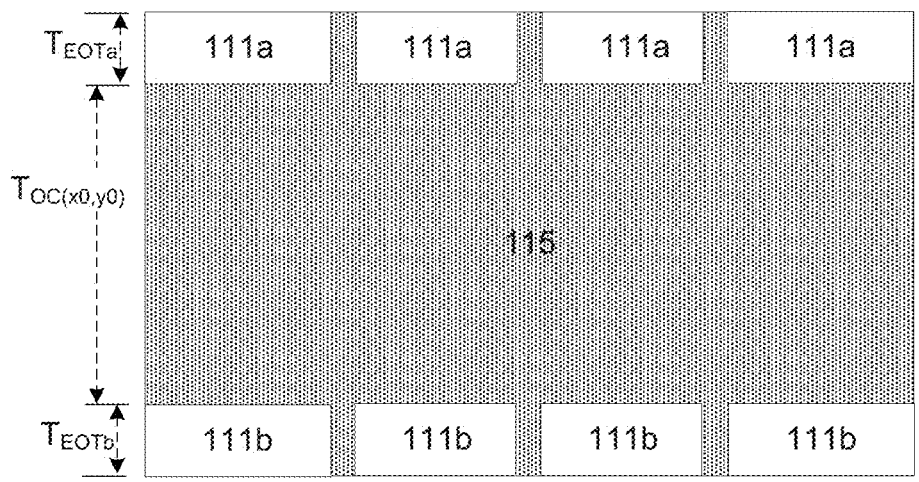
Figure 1E:
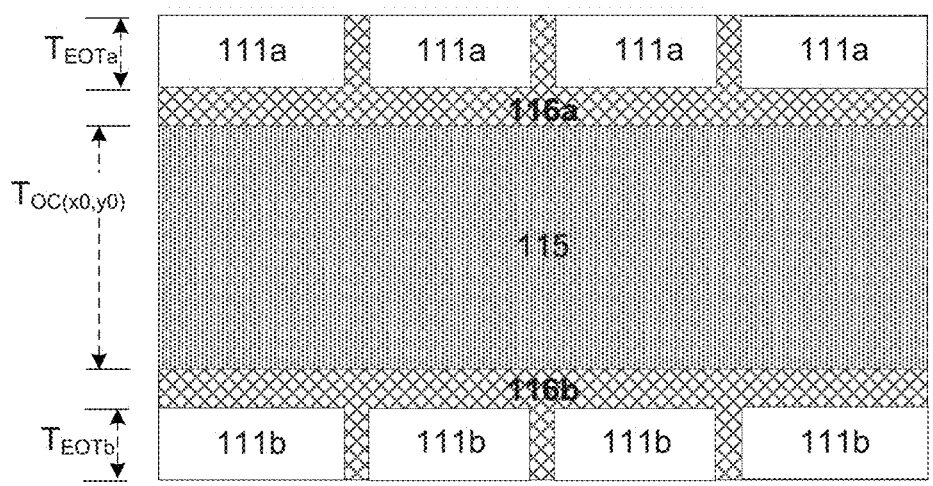

FIGS. 1C-1E each illustrate an exemplary tunable EOT filter 110 of an EOT filter device, such as the EOT filter device 100 of FIGS. 1A and 1B. As shown in FIGS. 1C and 1D, in some embodiments, EOT filter 110 may comprise EOT films 111a and 111b that may be configured to form an optical resonator or optical cavity 115. As shown in FIG. 1E, in other embodiments, EOT filter 110 may comprise EOT films 111a and 111b and EOT buffers 116a and 116b that, together, may be configured to form optical cavity 115.

In exemplary embodiments, each of EOT films 111a and 111b may comprise a thin film or plate that has been patterned with regular, periodic subwavelength apertures 114. Without such apertures 114, the EOT films 111 may be opaque and have a transmittance (at normal incidence) less than 5% for the spectrum of light with which the filter 110 is designed to operate (discussed further below) including targeted wavelengths $\lambda_{target}$ to be transmitted through EOT filter 110. However, in alternative embodiments, the EOT films 111 may be partially transparent films or plates. Generally, the term "subwavelength aperture" may describe an opening in EOT film 111 that has one or more dimensions (perpendicular to the thickness of EOT film 111) smaller than the targeted wavelengths $\lambda_{target}$ to be transmitted through EOT filter 110. In some embodiments, EOT films 111 that have regularly repeating subwavelength apertures may minimize or eliminate standard diffraction effects. The regularly repeating surface apertures of EOT films 111a and 111b may be the same as, or different from, one another. The regularly repeating surface apertures of EOT films 111a and 111b are aligned with each other in FIGS. 1A-1E. However, in alternative embodiments, the regularly repeating surface apertures of EOT films 111a and 111b may be offset from one another.

EOT films 111 may be formed from a single material or from combinations of materials, and may be comprised of non-conductive or conductive material. For example, EOT films 111a and 111b may comprise a doped semiconductor (e.g., zinc selenide (ZnSe), germanium (Ge), etc.), metals (e.g., aluminum, silver, gold, copper, or alloys thereof), etc. EOT films 111 may allow for transmission of light through the EOT films via extraordinary optical transmission, whereas the EOT film 111 may be are otherwise opaque or otherwise not able to transmit light without the provision of the subwavelength apertures 114. As described herein, an EOT film 111 that is opaque to light may be understood to be one that has a thickness sufficient to create a less than 5% transmittance for a given wavelength or bands of wavelengths.

By using extraordinary optical transmission to allow light to be transmitted through the EOT film, the EOT film material may be selected to have a high reflectance and/or high transmittance. In addition, the EOT film material may have high reflectance and/or high transmittance with a simple structure, such as being formed from a single homogenous layer of a high reflecting material. In many implementations, proper selection of material for a single homogeneous EOT film layer (e.g., solid Al, Ag, Au, etc.) allows a reflectance of the EOT film equal to or greater than 70%, equal to or greater than 85% or even greater than 90%. In some implementations, using a single homogenous layer as the EOT film, a reflectance of the EOT film of at least 95% was obtained. High reflectance assists the constructive and destructive interference of light within the optical cavity such that light having the target wavelength (or target narrowband of wavelengths) is better amplified with respect to wavelengths outside the target narrowband at the output of the EOT filter.

As noted, use of EOT film for the EOT filter also allows selection of materials with high transmittance. High transmittance of light through the EOT films may compensate for lower reflectance (and thus lower constructive interference in the optical cavity) as more light is initially transmitted into the optical cavity through the upper EOT film. Thus, less amplification (via reflectance within the optical cavity) is needed when the initial amount of light input into the cavity is relatively high. High transmittance of an EOT film also allows can be efficient in the output of light from the filter device through the second EOT film as well.

In general, the combination of reflectivity and transmittance of the EOT film reflects an efficiency of the EOT filter. Light that is neither reflected nor transmitted is lost to the system. Mostly, this light is considered to be absorbed, but some of this light may be lost to scattering. Thus, the higher the sum of the reflectivity and transmittance of the individual EOT films of the optical cavity, the higher the efficiency of the EOT filter. In using EOT films, a combined reflectivity and transmittance of 97% or greater can be obtained with readily available materials and simple manufacturing techniques that achieve high yield.

For example, it has been found that a reflectance even as low as 65% will work reasonably well, when transmittance of the EOT film is relatively high. For example, an EOT film with a reflectance of 90% and a transmittance of 7% might provide overall transmittance results commensurate with an EOT film having 60% reflectance and 37% transmittance although the latter will have a broader transmission band width. It will be appreciated that the same EOT film may have different reflectance and transmittance values for different wavelengths of light. However, implementations of EOT films consistent with embodiments described herein have provided a combined reflectivity and transmittance of 97% or greater across the spectrum of light to be analyzed (e.g., visible, SWIR, LWIR, etc.). It will be appreciated that the discussion regarding the reflectance and transmittance of the EOT film should not be confused with the properties (e.g., reflectance and transmittance) of the EOT filter itself, such as that described with respect to the embodiments of FIGS. 7A-7D.

It will be appreciated, that using a single homogenous layer as the EOT film can greatly simplify manufacturing of the filter device, which may improve yield and/or lower costs. However, it should be appreciated that the invention is not limited to single homogenous films for an EOT film and may be implemented with multiple layered EOT films, for example.

Referring to FIGS. 1A and 1C, as examples, EOT films 111 may have a length measured in the X-direction and a width measured in the Y-direction, which is orthogonal to the X-direction. As used herein, the terms X-direction, Y-direction, and Z-direction are used to describe relative directions, rather than absolute directions. For example, as illustrated in FIG. 1B, EOT films 111 may be round, and the directions may be described in angles relative to 0 degrees (e.g., 90 degrees, 180 degrees, 270 degrees, etc.) The length, width and/or diameter of EOT film 111a may be the same as or different from the length, width and/or diameter of EOT film 111b.

EOT films 111 each may include an upper surface 112 (e.g., upper surfaces 112a and 112b) and a lower surface 113 (e.g., lower surfaces 113a and 113b). The periodic structure of the subwavelength patterns or gratings in the EOT films 111 may result in a surface plasmon resonance with the incident light coupling with the surface plasmons of the upper surface 112 of the EOT film 111a. A relatively broadband filtering of the incident light may be performed on the incident light by EOT film 111a to transmit (via EOT) a broadband of light, including targeted wavelengths $\lambda_{target}$. Light outside this broadband may not be transmitted by EOT film 111a and instead be reflected or absorbed by EOT film 111a.

EOT film 111a may have a thickness $T_{EOTa}$ measured between upper surface 112a and lower surface 113a, and EOT film 111b may have a thickness $T_{EOTb}$ measured between upper surface 112b and lower surface 113b (here, in the Z-direction, orthogonal to the X- and Y-directions). In some embodiments, thicknesses $T_{EOTa}$ and $T_{EOTb}$ may be substantially constant. In other embodiments, the EOT films 111a and 111b may have varying thicknesses (e.g., thicknesses dependent on the location in the X- and/or Y-directions). The thicknesses $T_{EOTa}$ and $T_{EOTb}$ may be the same as, or different from, one another. In certain embodiments, thickness $T_{EOTa}$ may be the same as thickness $T_{EOTb}$.

Upper surfaces 112 and lower surfaces 113 may be adjacent and/or exposed to the same or different media. For example, upper surface 112a may face a first direction and be exposed to air, whereas lower surface 113a may face a second direction, opposite the first direction, and be adjacent to a different dielectric material (e.g., glass). Similarly, upper surface 112b may face a first direction and be adjacent to a solid dielectric material, while lower surface 113a may face a second direction, opposite the first direction, and be adjacent to air or another dielectric material. The refractive indices of EOT films 111a and 111b may be the same as, or different from, one another. EOT films 111 may have refractive indices that are higher than materials to which EOT films 111 are adjacent and/or exposed.

EOT films 111 may include a plurality of apertures 114 (e.g., apertures 114a and 114b). Apertures 114 may be subwavelength slits or gratings (SVGs) formed in EOT films 111. The width of the slits (or slits of the gratings) may be less than one wavelength of the light filter 110 filters. The apertures 114 may be regularly or periodically repeated across the EOT films 111. The term pitch (P) is used herein to describe the spacing between the regularly spaced apertures 114. Referring to FIG. 1C, as an example, the pitch P of apertures 114 may be measured from the start of one aperture 114 to the start of an adjacent aperture 114. EOT films 111 may have a "fill factor" or "grating duty cycle" that describes the proportion of the aperture size to the pitch P of the aperture 114 in EOT film 111. For example, a metal fill factor of 80% may indicate that 80% of the EOT film 111 constitutes metal and 20% constitutes apertures 114. EOT films 111 may have a high fill factor grating with a pitch P that allows for resonant transmission of specific wavelengths through highly lossy metals that would otherwise be opaque. For example, EOT films 111 may be low loss semiconductor or metal thin films with subwavelength apertures or gratings (SWG) 114.

While FIGS. 1A, 1C, 1D, and 1E illustrate apertures 114 as gratings or elongated slits, apertures 114 may be other shapes including, for example, circular, elliptical, rectangular, etc. The circular, elliptical or rectangular openings may be regularly repeated in the Y-direction with the same or different pitch P as that in the X-direction. Further, it should be appreciated that certain of FIGS. 1A-1E depict three apertures 114a and three apertures 114b for ease of explanation, and that EOT films 111 may contain any number of apertures 114. The size, shape, and/or pitch P of apertures 114a and 114b may be the same as, or different from, one another. In exemplary embodiments, the size, shape, and pitch P of apertures 114a are shown as the same as the size, shape, and pitch P of apertures 114b, however one or more of the size, shape and pitch P of apertures 114a and 114b may differ in the disclosed embodiments. Apertures 114a and 114b may be offset from, or aligned with, one another.

Referring to FIGS. 1C and 1D, EOT films 111a and 111b may be separated by optical cavity 115. For example, optical cavity 115 may be formed between the lower surface 113a of EOT film 111a and the upper surface 112b of EOT film 111b. Reflective surfaces 113a and 112b may cause optical cavity 115 to form a resonant optical cavity. Referring to FIG. 1E, in some embodiments, buffers 116 may be formed between EOT films 111 and optical cavity 115. For example, buffer 116a may be formed between lower surface 113a of EOT film 111a and optical cavity 115, and buffer 116b may be formed between upper surface 112b of EOT film 111b and optical cavity 115.

In some embodiments, optical cavity 115 may be formed of materials having low transmission loss characteristics. For example, optical cavity 115 may be a transparent medium, such as, air, a solid dielectric such as glass, etc. Optical cavity 115 may have a refractive index that is lower than the refractive indices of EOT films 111a and 111b. Optical cavity 115 may thus act as a resonator, interferometer or standing wave cavity. For example, light introduced into the optical cavity 115 may reflect several times between lower surface 113a and upper surface 112b. In the optical cavity 115, light $L_{int}$ having certain wavelengths may destructively interfere with each other and be reduced in its intensity (e.g., eliminated), while light of other wavelengths may resonate (constructively interfere) prior to transmission (via EOT) through lower EOT film 111b.

The thickness $T_{OC}$ of optical cavity 115 (as measured as the distance in the Z-direction between lower surface 113a of EOT film 111a and upper surface 112b of EOT film 111b) may affect the optical path length (OPL) of light as it travels through optical cavity 115. Generally, the OPL is the product of the refractive index η of optical cavity 115 and thickness $T_{OC}$ of optical cavity 115 (i.e., OPL=$T_{OC}$*η). The OPL may be used to selectively set or tune the wavelength of light that propagates through optical cavity 115 and out through lower EOT film 111b. For example, a broadband transmission of light through the upper EOT film 111a may have some of its light energy filtered as it traverses optical cavity 115 through destructive interference, resulting in a narrowband transmission of light through the lower EOT film 111b.

The OPL may be changed by, for example, changing the thickness $T_{OC}$ of optical cavity 115 and/or the refractive index of the material in optical cavity 115. In certain disclosed embodiments, the OPL may be changed dynamically by changing the thickness $T_{OC}$ of optical cavity 115 using, for example, actuators 130. In other embodiments, the refractive index of the material of optical cavity 115 may be changed via an electro-optic effect or a thermo-optic effect. For electro-optic, the refractive index of a material may be changed, for example, by applying an electric field across the material of the optical cavity 115. For thermo-optic, the refractive index of a material of the optical cavity 115 may be changed, for example, by changing the temperature of the material. Preferably, to change the refractive index of the material of optical cavity 115 by applying an electric field across or changing the temperature of the material of the optical cavity, the material for optical cavity 115 should be selected to have significant electro-optic and/or thermo-optic effects. By adjusting the OPL of the optical cavity 115, the light that resonates within the optical cavity 115 may be dynamically selected, so that the target wavelength of $\lambda_{target}$ transmitted through filter 110 may be dynamically selected in real time.

The distance between EOT films 111a and 111b (i.e., the thickness $T_{OC}$ of optical cavity 115) may be directly proportional to the targeted wavelength $\lambda_{target}$. For example, the thickness $T_{OC}$ of optical cavity 115 may be set to an integer multiple of one half of the target wavelength of $\lambda_{target}$ within the optical cavity 115 (note that the wavelength within optical cavity 115 may differ from its wavelength outside optical cavity 115 due to differing refractive indices of the mediums through which the light is being transmitted). The thickness $T_{OC}$ of optical cavity 115 may be set or tuned dynamically by, for example, piezo-electric actuation (e.g., applying a voltage across piezoelectric actuators 130) that changes the distance between EOT films 111a and 111b.

Returning to FIGS. 1A and 1B, optical windows 120 may be comprised of transparent optical material that allows light into EOT filter 110 (i.e., EOT films 111, apertures 114, and optical cavity 115). In the example illustrated in FIG. 1B, optical windows 120 may have a round shape, and may be larger than EOT filter 110. The optical window 120 may extend fully across to fully cover EOT films 111. The material comprising optical windows 120 may vary based on the targeted wavelength $\lambda_{target}$. For example, if the targeted wavelength $\lambda_{target}$ is in the visible spectrum, optical windows 120 may be formed from silicon dioxide. If the targeted wavelength $\lambda_{target}$ is in the near-infrared spectrum, optical windows may be formed from, for example, silicon, silicon dioxide, gallium arsenide, germanium, indium phosphide, etc. And, if the targeted wavelength $\lambda_{target}$ is in the long-wave infrared spectrum, optical windows 120 may be formed from, for example, zinc selenide, zinc sulfide, germanium, etc. Optical windows 120 may be adjacent to EOT films 111. The EOT films 111a and 111b may be formed directly on surfaces of optical windows 120a and 120b, respectively.

Actuators 130 may comprise piezoelectric actuators or films. In some embodiments, actuators 130 may be standard, commercially-available actuators. In other embodiments, actuators 130 may be piezoelectric material film that is deposited and patterned between EOT films 111 and be monolithically integrated with the remaining portions of filter 110 via manufacturing. Actuators 130 may be disposed near EOT films 111, but outside of an area through which light is transmitted through EOT films 111 and optical cavity 115. Referring to FIG. 1O, for example, actuators 130 may be positioned such that they do not block or interfere with light as it passes through EOT films 111 and optical cavity 115.

Actuators 130 may be attached to optical windows 120, and be configured to increase and/or decrease the thickness $T_{OC}$ of optical cavity 115. For example, referring to FIG. 1A, an epoxy may be used to attach each of the top surfaces of actuators 130a and 130b to optical window 120a, and attach each of the bottom surfaces of actuators 130a and 130b to optical window 120b. When actuators 130 are used to increase the thickness $T_{OC}$ of optical cavity 115, an electrical voltage may be applied to actuators 130. For example, actuators 130 may convert received electrical voltage into a mechanical energy that causes the actuators 130 to expand, and thereby increase the thickness $T_{OC}$ of optical cavity 115. Actuators 130 may have a length that is the same as the combined thicknesses of optical cavity $T_{OC}$ and EOT films 111a and 111b such that, when one end of actuator 130 is attached to optical window 120a and the other end of actuator 130 is attached to optical window 120b, actuator 130 spans the total height of EOT filter 110 (e.g., the combined thicknesses of $T_{OC}$, $T_{EOTa}$, and $T_{EOTb}$).

In the embodiments illustrated in FIGS. 1A-1C, the targeted wavelengths $\lambda_{target}$ to be transmitted through tunable EOT filter device 100 may be a function of one or more of the size, shape, or pitch P of apertures 114 and/or the thickness $T_{OC}$ of optical cavity 115. The size, shape, and pitch of apertures 114 may be selected so that EOT films 111 act to transmit a certain spectrum (e.g., broadband) of light. Different sizes, shapes, and/or pitches of apertures 114 may be used to transmit different spectrums (a different broadband) through the EOT films 111. The light transmitted through filter 110 may be a narrowband selected from the broadband of light transmitted by EOT films 111. By changing the OPL of the optical cavity 115, such as by changing the thickness $T_{OC}$ of optical cavity 115 and/or the refractive index of the material in optical cavity 115, the wavelengths transmitted through EOT filter device 100 may be dynamically selected. In some embodiments, to achieve zero-order operation of apertures 114, the pitch P of apertures 114 may be smaller than a corresponding targeted wavelength $\lambda_{target}$, such that pitch P<$\lambda_{target}$. To minimize or eliminate diffraction effects, the width and pitch P of apertures 114 may be smaller than the wavelengths of light received.

Figure 2:
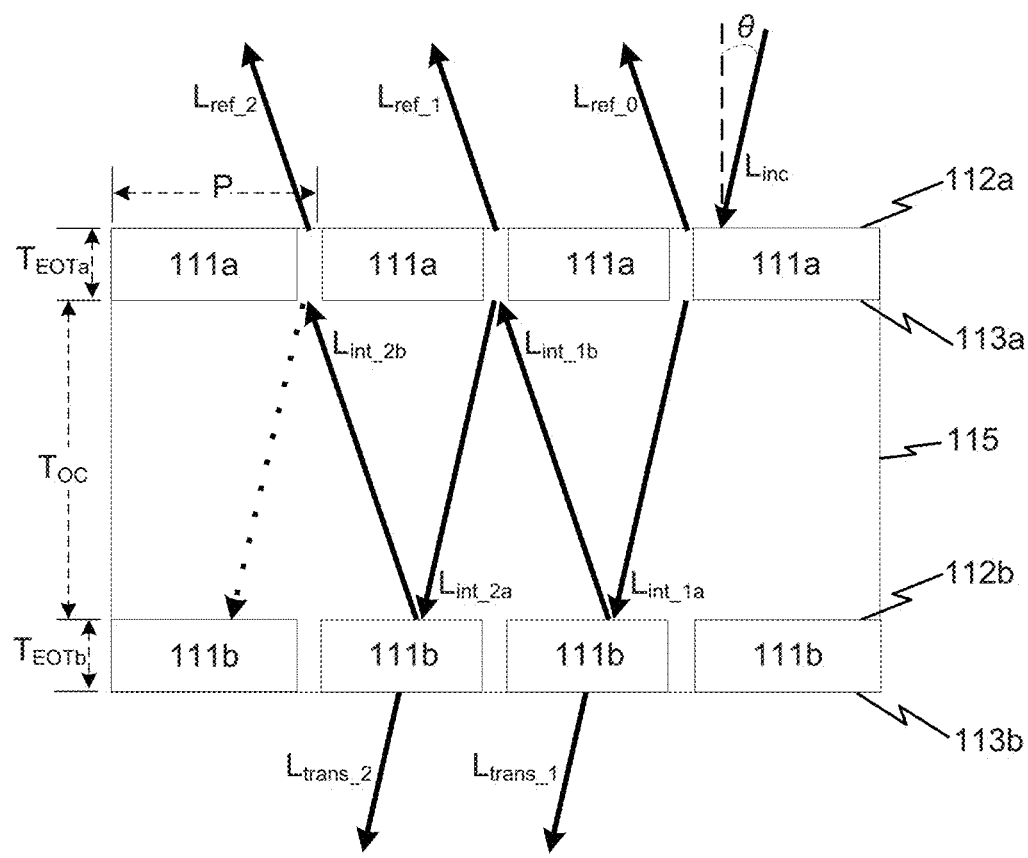
FIG. 2 is a diagram illustrating filtering in an EOT filter device having an exemplary tunable EOT filter, according to certain disclosed embodiments.

FIG. 2 illustrates filtering in an EOT device having an exemplary tunable EOT filter, which may comprise EOT filter 110 of FIGS. 1A-1C, consistent with certain disclosed embodiments. In FIG. 2, example tunable EOT filter 110 may include an optical cavity 115 disposed between EOT films 111a and 111b. EOT films 111a and 111b act as broadband filters and mirrors. As discussed above the targeted wavelengths $\lambda_{target}$ may be set, or tuned, based on the sizes, shapes, configurations, and media of EOT films 111, apertures 114, and optical cavity 115. Although not shown in FIG. 2, tunable EOT filter 110 may be included in a tunable EOT filter device 100 that also includes optical windows 120 and actuators 130, as illustrated in FIGS. 1A and 1B.

In some embodiments, the combination of the pitch and fill factor of the grating determines the transmission of the broadband of light (including the targeted wavelengths $\lambda_{target}$) through a single EOT film. Further, configuring two EOT films 111 to form optical cavity 115 may produce a narrow transmission window that can be controlled by changing the thickness $T_{OC}$ of optical cavity 115. In FIG. 2, when incident light is applied to tunable EOT filter 110, the targeted wavelengths $\lambda_{target}$ may pass through tunable EOT filter 110 with minimal to no diffraction or diffusion. Thus, an entire image may be filtered simultaneously to produce a filtered image with minimal or no blurring or loss of sharpness of the image. The EOT films 111 may act as broadband filters to pass a relatively wide spectrum of light (or broadband transmission), including one or more targeted wavelengths $\lambda_{target}$. The configuration of apertures 114 (e.g., size and pitch), the maximum thicknesses $T_{EOT}$ of EOT films 111, and the media comprising EOT films 111 may be designed to select the broadband spectrum. For example, the broadband spectrum of light passed by the EOT films 111 may be all or some of visible light, shortwave infrared, mid-wave infrared, longwave infrared, microwave, millimeter waves, ultraviolet, etc. Optical cavity 115 may act to narrow the corresponding broadband spectrum passed by the upper EOT film 111a so that a narrower band of light (e.g., 20% or less of the broadband spectrum) exits the lower EOT film 111b. By altering the optical path length of optical cavity 115, the frequency of the narrowband may be changed (e.g., the center frequency of the emitted narrow band of light may be shifted).

For example, rays of incident light $L_{inc}$ that correspond to set or tuned targeted wavelengths $\lambda_{target}$ may be allowed to pass through EOT film 111a (i.e., $L_{int\_1a}$), while other rays may be filtered out (i.e., $L_{ref\_0}$). In the embodiment of FIG. 2, light rays that are passed through EOT film 111a into optical cavity 115 may be reflected multiple times within cavity 115 between the EOT films 111a and 111b until they are transmitted through EOT films 111. For example, when $L_{int\_1a}$ reaches upper surface 112b of EOT 111b, a portion of $L_{int\_1a}$ may be transmitted through EOT 111b (i.e., $L_{trans\_1}$), while a portion of $L_{int\_1a}$ may be reflected back to lower surface 113a of EOT 111a (i.e., $L_{int\_1b}$), at which point a portion of $L_{int\_1b}$ may be transmitted through EOT 111a (i.e., $L_{ref\_1}$), and a portion of $L_{int\_1b}$ may be reflected back to upper surface 112b of EOT 111b (i.e., $L_{int\_2a}$). When $L_{int\_2a}$ reaches upper surface 112b of EOT 111b, a portion of $L_{int\_2a}$ may be transmitted through EOT 111b (i.e., $L_{trans\_2}$), while a portion of $L_{int\_2a}$ may be reflected back to lower surface 113a of EOT 111a (i.e., $L_{int\_2b}$), at which point a portion of $L_{int\_2b}$ may be transmitted through EOT 111a (i.e., $L_{ref\_2}$), and so on.

The transmission function of tunable EOT filter 100 may vary based on interference between the multiple reflections of light in optical cavity 115. For example, constructive interference may occur when the transmitted wavelengths of light $L_{trans\_i}$ are in-phase, resulting in a higher peak transmission. As illustrated in FIG. 2, for example, when $L_{trans\_1}$, $L_{trans\_2}$, etc. are in-phase, the transmission efficiency at the targeted wavelengths $\lambda_{target}$ may increase.

In FIG. 2, the angle θ is the angle between the normal to the first surface and the line representing the incident light. Further, the angle θ may be minimal or not exist so that incident light $L_{inc}$ may be applied to EOT filter 110 perpendicularly to an upper surface 112a of EOT filter 110.

Figure 3:
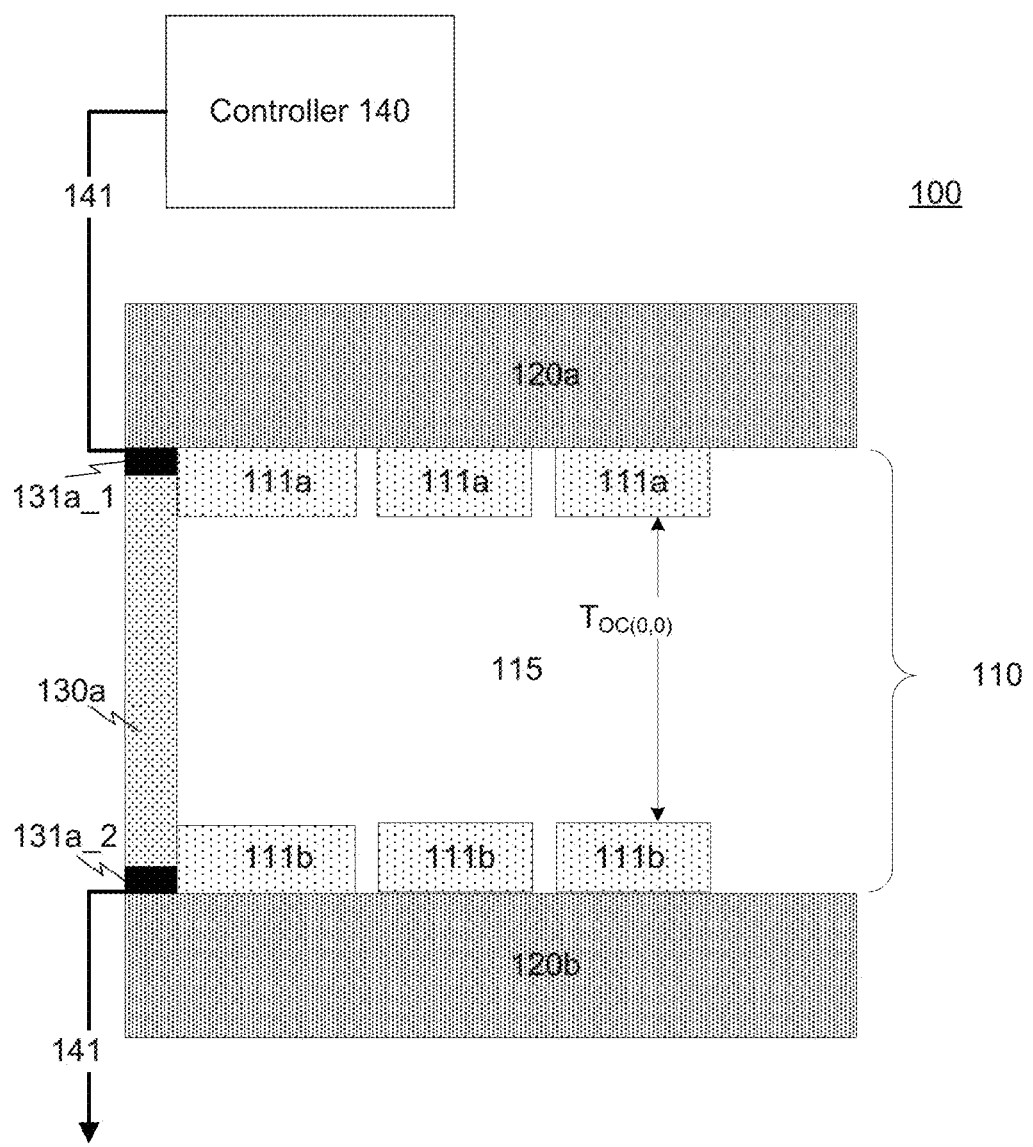
FIG. 3 is a diagram illustrating dynamic tuning in an EOT filter device having an exemplary EOT filter, according to certain disclosed embodiments.

FIG. 3 illustrates dynamic tuning of an exemplary EOT filter device 100 having a tunable EOT filter, such as tunable EOT filter 110 of FIGS. 1A-1C. As discussed above, EOT filter 110 may be tunable by changing one or both of the properties of the material comprising optical cavity 115 and/or a length of optical cavity 115. For example, EOT filter 110 may be tuned by changing the refractive index of the material of the optical cavity 115 and/or by changing the distance between EOT films 111 (i.e., the thickness $T_{OC}$ of optical cavity 115) using actuators 130. FIG. 3 illustrates a single actuator 130 for simplicity, but it is anticipated that multiple actuators 130 may be used.

In FIG. 3, example EOT filter 110 of EOT filter device 100 may be set or tuned dynamically by changing the distance between EOT films 111. For example, the thickness $T_{OC}$ may be changed using actuators 130 of FIGS. 1A and 1B. As shown in FIG. 3, actuators 130 may be attached to optical windows 120 and disposed near EOT films 111. In some embodiments, a controller 140 may be used to apply an electrical voltage across actuator pads 131 (i.e., upper actuator pads 131a and lower actuator pads 131b) via lines 141. Upon application of electrical voltage across actuator pads 131, actuators 130 may expand in length, thereby increasing a distance between EOT films 111a and 111b (i.e., the thickness $T_{OC}$ of optical cavity 115). In certain embodiments, increasing cavity thickness $T_{OC}$ may shift the frequency of the transmitted narrowband of light. It should also be noted that the number of narrow bands that are transmitted by tunable EOT filter 110 may be more than one.

Figure 4A:
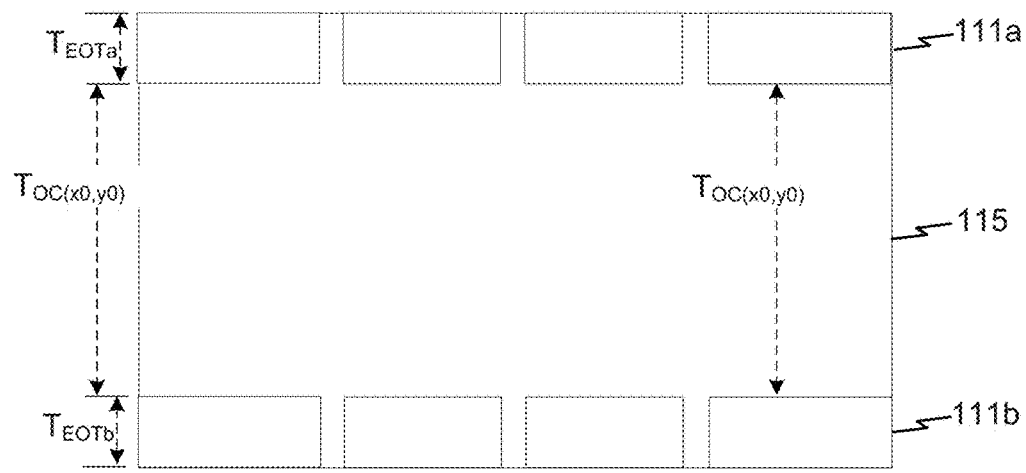
FIGS. 4A-4C are cross-sectional diagrams illustrating exemplary EOT filters of tunable EOT filter devices, according to certain disclosed embodiments.
Figure 4B:
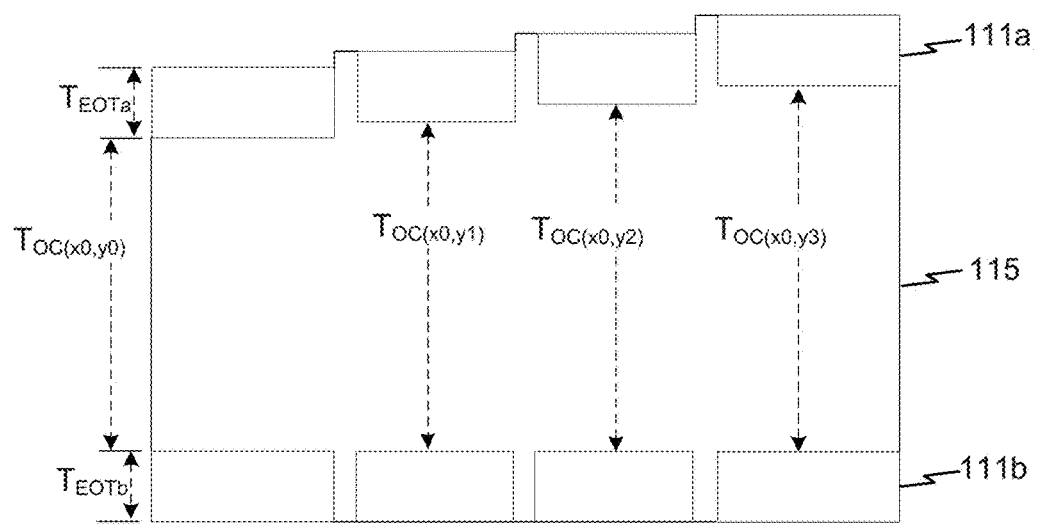
Figure 4C:
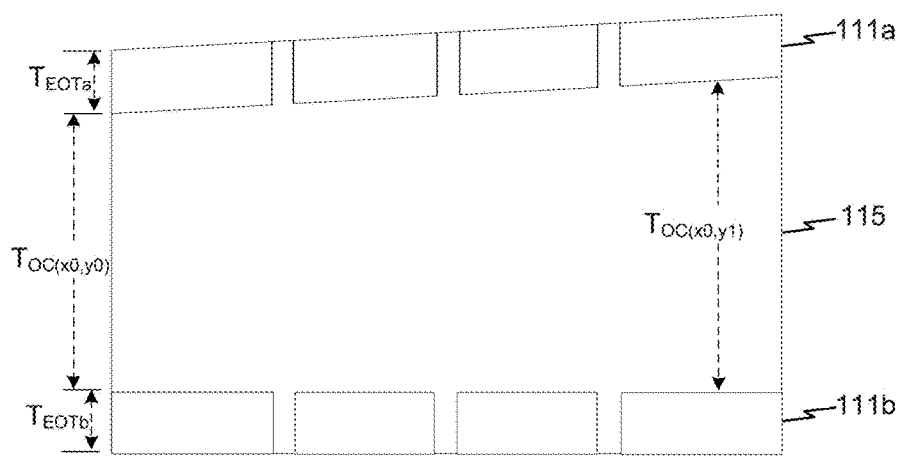

FIGS. 4A through 4C are cross-sectional diagrams illustrating exemplary EOT filters of tunable EOT devices, such as EOT filters 110 of tunable EOT devices 100, consistent with certain disclosed embodiments. In FIGS. 4A through 4C, optical cavity 115 is formed between EOT films 111a and 111b, and has a thickness $T_{OC}$ in the Z-direction between lower surface 113a of EOT film 111a and upper surface 112b of EOT film 111b.

In FIG. 4A, the distance between EOT films 111a and 111b may remain the same in all directions. For example, as illustrated in FIG. 4A, the distance between EOT films 111a and 111b may remain constant and the thickness $T_{OC}$ of optical cavity 115 may be unchanged at all points (x, y). In FIG. 4B, the distance between EOT films 111a and 111b may change and the thickness $T_{OC}$ of optical cavity 115 may be different at different points (x, y). For example, as illustrated in FIG. 4B, the thickness $T_{OC}$ may increase in a linear fashion in one direction. Although not illustrated, in some embodiments, the thickness $T_{OC}$ of optical cavity 115 may increase in a linear fashion in multiple directions. In the exemplary embodiments of FIGS. 4B and 4C, the gradient change in the thickness $T_{OC}$ of optical cavity 115 may result in a spatially variant transmission spectrum. That is, different parts of the filter 110 may transmit different targeted wavelengths or different targeted narrowband of wavelengths. In order to create a filter with a spatially varying center wavelength, the thickness of the material between the metal layers can be deposited with a thickness variation that matches the desired spectral variation. In the example of FIG. 4B, the change in optical cavity thickness may change in a discontinuous fashion (e.g., stepwise changes). In the example of FIG. 4C, the change in the thickness $T_{OC}$ is illustrated as a gradual linear change. EOT filters 110 having a variable thickness $T_{OC}$ of optical cavity 115 may include, but not be limited to, linear variable filters (LVF), radial variable filters, random variable filters, etc.

When using variable EOT filters 110, such as disclosed in FIGS. 4B and 4C, hyperspectral information may be collected using, for example, push-broom/whisk-broom and step-stare techniques. In the push-broom and whisk-broom techniques, a moving scene may be captured using an EOT filter device that is spatially variant (e.g., LVF). In such embodiments, each line of pixels of an array of pixels of an image sensor in an imaging system may collect a 1D scan of a scene at its corresponding wavelength. Then, as the imaging system moves and/or is scanned, the second dimension of the scene may be collected (by the corresponding line of pixels of the imaging sensor) to thereby form a 2D image at each wavelength. This may be done simultaneously for a plurality of rows of pixels of the image sensor so that a 2D image scan of different wavelengths of interest are obtained for each of row of pixels. In some embodiments, the thickness $T_{OC}$ of optical cavity 115 may be graded continuously (e.g., see FIG. 4C). In other embodiments, the thickness $T_{OC}$ of optical cavity 115 may change discontinuously (e.g., see FIG. 4B). The locations of the different thicknesses $T_{EOT}$ of EOT film 111 may be selected match the pixel pitch of an image sensor receiving an image filtered by EOT filter 110. Thus, different pixels of the image sensor may receive different narrowband targeted wavelengths (e.g., for filtering a visible spectrum, different pixels of the image sensor may selected to receive one of red, green and blue light passed through filter 110. In alternative examples, the variance in the thickness of the cavity may be a linear function of the X and or Y coordinates (e.g., a linear function of the distance from an edge of the EOT filter 110) whether in a continuous (like FIG. 4C) or discrete fashion (like FIG. 4B). In other examples, the varied thickness of the optical cavity 115 may be repeated across the EOT filter so that a cluster of pixels on an image sensor may each capture different wavelength image information at substantially the same spot in the image. In some embodiments, each "step" in the varied thickness of optical cavity 115 of FIG. 4B may correspond to a separate pixel of an image sensor so that neighboring pixels of the image sensor sense light intensity of different wavelengths (or narrow bands of wavelengths). This structure may be repeated across the filter 110 (not shown) so that these different wavelengths may be sensed, stored and processed across the image simultaneously.

In the step-stare technique, first, an entire scene may be captured at a single wavelength or narrowband of wavelengths. Then, using a tunable optical filter, the spectral information of the 2D scene may be successively captured at different wavelengths (or different narrow bands of wavelengths). For example, in a video camera, an image may be projected by lenses of the video camera through the filter 110 onto an image sensor of the video camera. The image sensor may capture the filtered image as a sequence of video frames. Each frame or a consecutive group of a plurality of frames may capture a particular wavelength (or narrowband of wavelengths) of the image as output by the filter 110. The filter may then change its OPL (e.g., by changing the distance between EOT films 111 via piezoelectric actuators 130) to change the wavelength (or narrowband of wavelengths) to be sensed by the image sensor and stored as a filtered image frame. The push-broom and whisk-broom techniques may not require a dynamically-changing optical filter, while the stare-step technique may allow for a more robust image capture process with the ability to easily integrate at selected wavelengths to increase signal to noise ratio (SNR). Using the step-stare technique, the center wavelength of the narrowband may be tuned simultaneously such that every pixel of the image sensor can be used to capture data at each center wavelength.

Figure 5A:
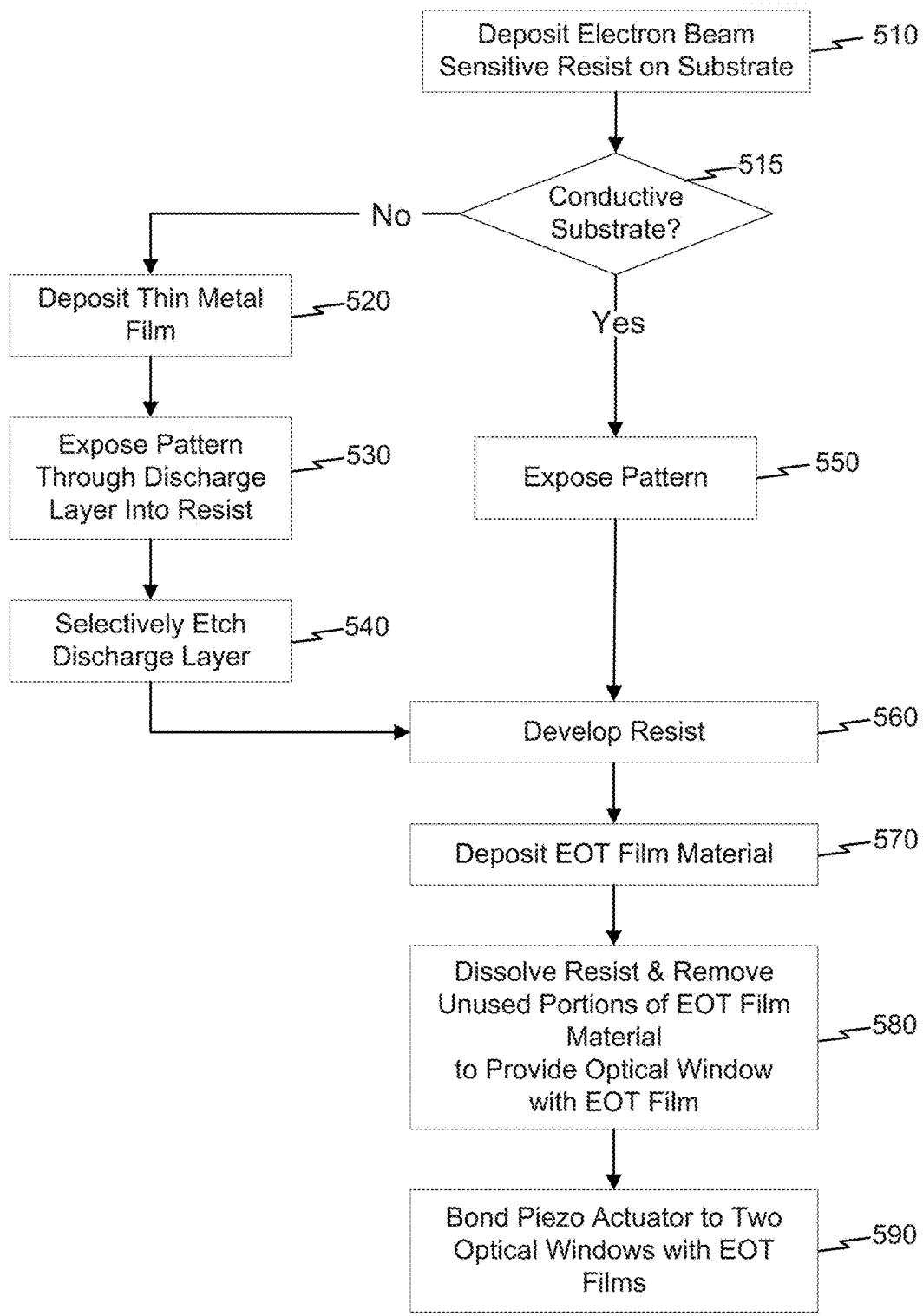
FIG. 5A is a flowchart of an exemplary fabrication process for EOT filter devices, according to certain disclosed embodiments.
Figure 5B:
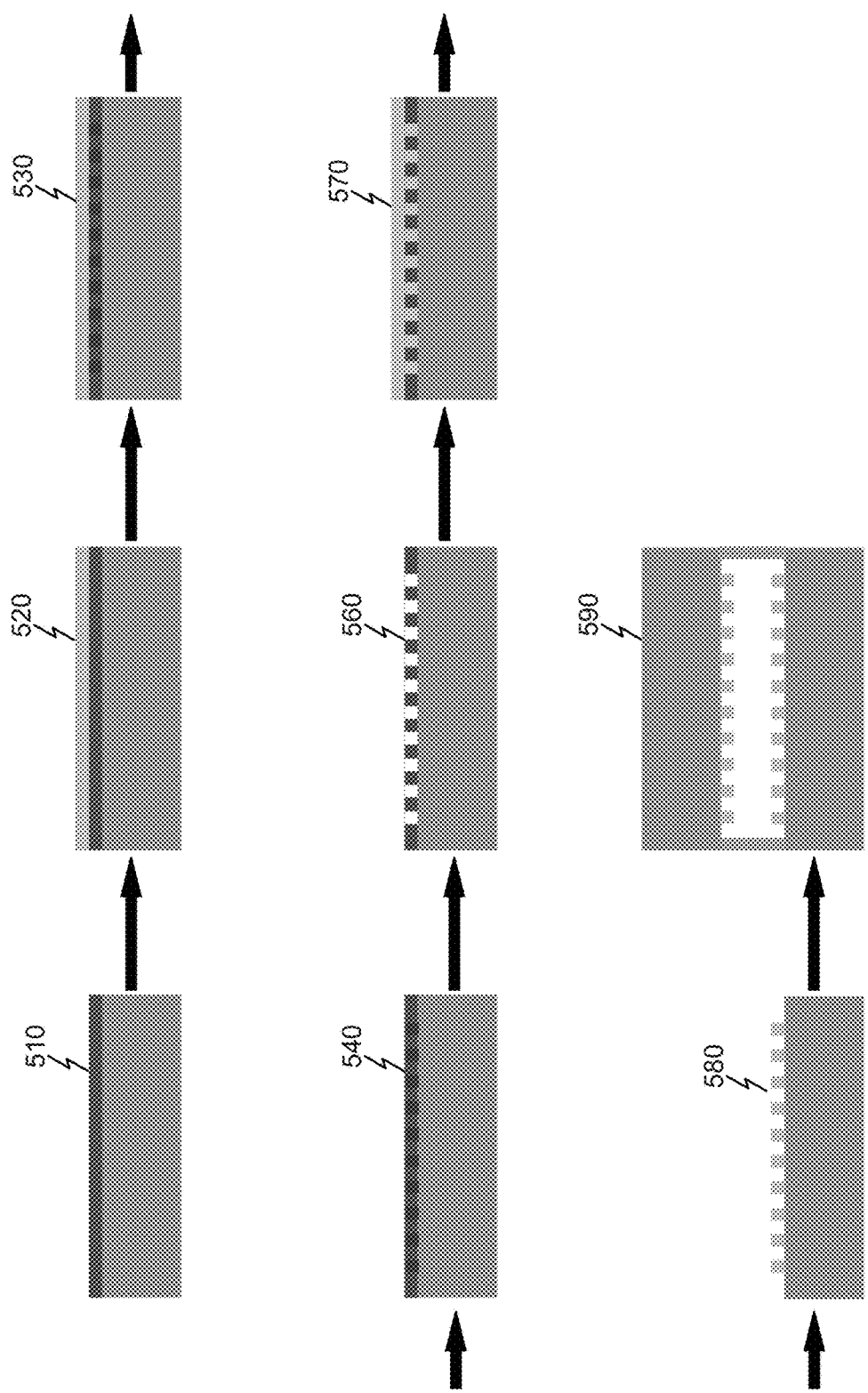
FIG. 5B is a block diagram illustrating the exemplary fabrication process of FIG. 5A, according to certain disclosed embodiments.

FIG. 5A is a flowchart 500 disclosing an exemplary process of fabricating tunable EOT devices, such as EOT filter device 100, consistent with certain disclosed embodiments. FIG. 5B is a series of block diagrams corresponding to flowchart 500 of FIG. 5A and illustrating an exemplary process of fabricating tunable EOT devices, such as EOT filter device 100. In the embodiments disclosed in FIGS. 5A and 5B, example tunable EOT filter device 100 may include EOT filter 110 (e.g., EOT films 111a and 111b, apertures 114, and optical cavity 115), optical windows 120a and 120b, and actuators 130 (e.g., actuators 130a and 130b).

Referring to FIGS. 5A and 5B, an electron beam resist may be deposited on a substrate (510). The substrate may be used as part of the filter 110 in the final device and the substrate may be transparent. For example, the electron beam sensitive resist may be deposited through a spin coating process. In the disclosed embodiments, the substrate may be optical window 120. If the substrate is conductive (515, Yes), a pattern may be exposed in the electron beam sensitive resist using, for example, electron-beam lithography (550), and the resist developed (560). It should be noted that step 515 is used to explain alternative manufacturing processes and may not be part of the implemented manufacturing process.

If the substrate is not conductive (515, No), a thin metal film may be deposited on the electron beam sensitive resist to prevent charging during exposure (520), after which the pattern may be exposed through the discharge layer into the electron beam sensitive resist (530), the metal discharge layer may be selectively etched (540), and the resist developed (560). Then, the material to be used as the EOT film may be deposited (570), and the resist may be dissolved and unused portions of the material deposited for the EOT film may be lifted-off to leave a final EOT film 111 and optical window 120 (580). The process may proceed to fabricating an EOT device 110 by, for example, bonding a desired number of actuators 130 to two sets of EOT films 111 and optical windows 120, as fabricated in steps 510-580, to form a tunable EOT filter device 100 with optical cavity 115 (590).

Figure 6A:
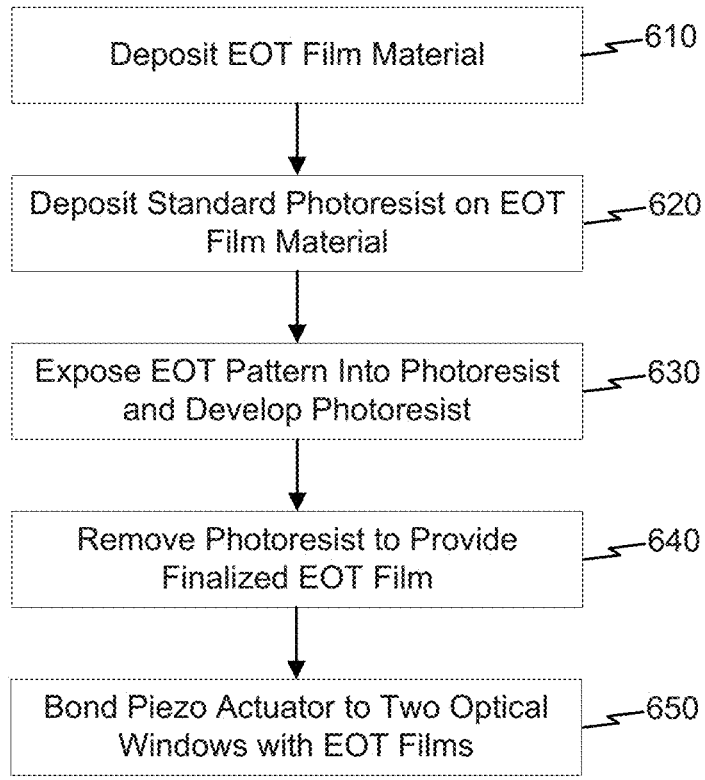
FIG. 6A is a flowchart of an exemplary fabrication process for EOT filter devices, according to certain disclosed embodiments.
Figure 6B:
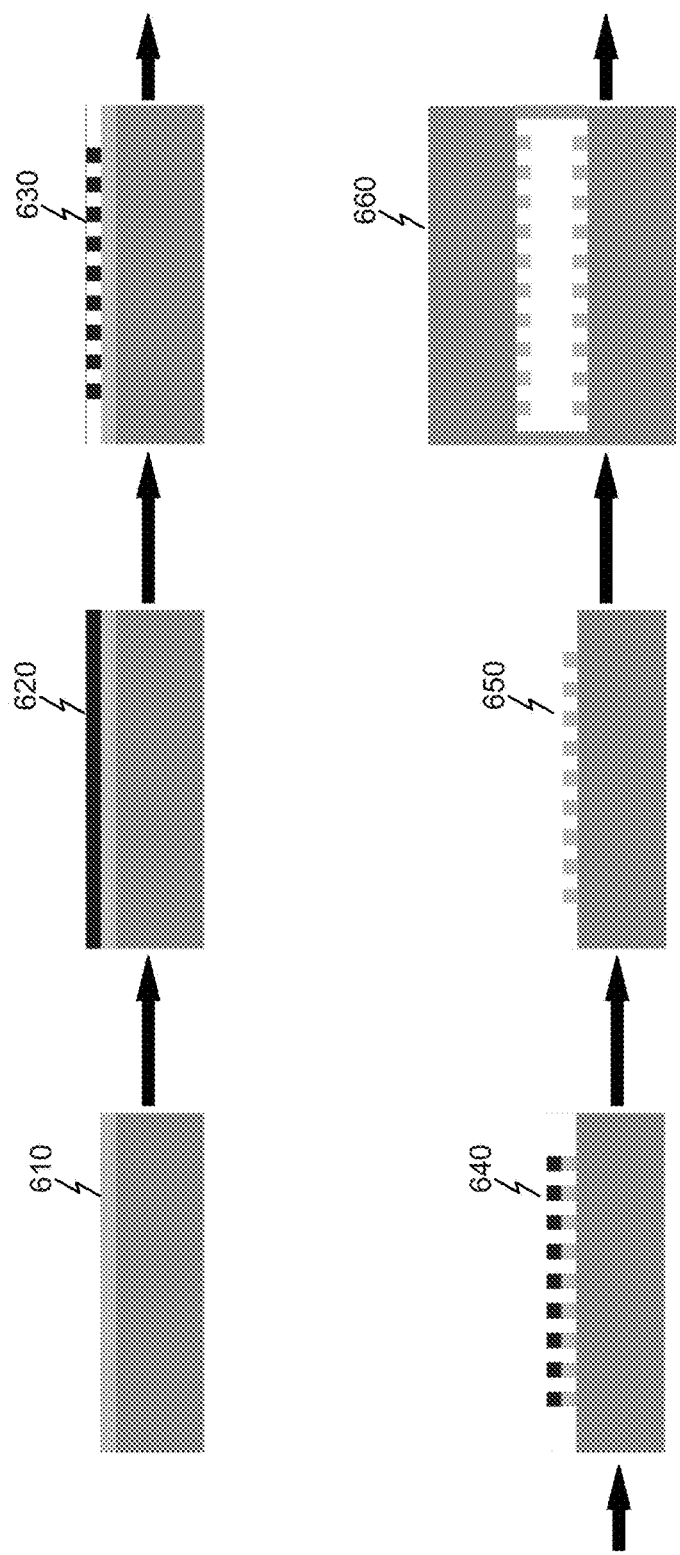
FIG. 6B is a block diagram illustrating the exemplary fabrication process of FIG. 6A, according to certain disclosed embodiments.

FIG. 6A is a flowchart 600 disclosing an exemplary process of fabricating tunable EOT devices, such as EOT filter device 100, consistent with certain disclosed embodiments. FIG. 6B is a series of block diagrams corresponding to flowchart 600 of FIG. 6A and illustrating an exemplary process of fabricating tunable EOT devices, such as EOT filter device 100. In the embodiments disclosed in FIGS. 6A and 6B, example tunable EOT filter device 100 may include EOT filter 110 (e.g., EOT films 111a and 111b, apertures 114, and optical cavity 115), optical windows 120a and 120b, and actuators 130 (e.g., actuators 130a and 130b).

Referring to FIGS. 6A and 6B, a metal film may be deposited on a substrate (610). In the disclosed embodiments, the substrate may be optical window 120. The metal film may be, for example, silver, gold, aluminum, copper, etc. A standard photoresist may be deposited on the metal film (615). In some embodiments, the photoresist may be deposited through a spin coating process. Then, the EOT pattern may be exposed into the photoresist and the photoresist may be developed (630). Next, the structure may be etched with a photoresist masking metal to transfer the EOT pattern into the metal (640), and the photoresist may be removed to leave a final EOT film 111 and optical window 120 (650). The process may proceed to fabricating an EOT device 110 by, for example, bonding a desired number of actuators 130 to two sets of EOT films 111 and optical windows 120, as fabricated in steps 610-650, to form an EOT filter device 100 with optical cavity 115 (660).

In the embodiments of FIGS. 5A-5B and 6A-6B, the substrate may be a semiconductor substrate. For example, the substrate may be a silicon substrate or a silicon on insulator (SOI) substrate. EOT films 111 and apertures 114 may be formed on or above the substrate. In some embodiments, EOT films 111 may be formed of a material having a dielectric constant greater than or equal to that of the substrate. Optical cavity 115 may be formed on or above EOT films 111 and apertures 114. As shown in FIGS. 5B and 6B, optical cavity 115 may be formed of, or bounded by, EOT films 111 and apertures 114, as well as optical windows 120 and actuators 130.

In some embodiments, EOT films 111 and apertures 114 may be formed by a damascene process comprising depositing an insulator (e.g., $SiO_2$), and patterning the insulator to provide a raised pattern corresponding to apertures 114 to be formed in the EOT film 111 with the openings in the insulator corresponding to the metal of the apertures 114. Metal may be blanket deposited (e.g., via a sputtering or a chemical vapor deposition (CVD) process) to fill the openings in the insulator and cover the patterned insulator. A planarization process such as chemical mechanical polishing (CMP) may be applied to the resulting structure until the patterned insulator is exposed. In other examples, a metal film may be deposited on the substrate, and apertures 114 may be formed by etching into the metal film to form the patterned EOT films 111.

Although only one filter device is illustrated as being manufactured in the process illustrated in FIGS. 5A-5B and 6A-6D, a plurality of these filters may be made simultaneously on a single wafer (as with typical semiconductor manufacturing processes) and each filter may then be singulated (cut) from the wafer.

Moreover, patterning techniques to achieve the required subwavelength gratings can be processed using standard i-line contact photolithographic methods, to achieve dimensions that are approximately 1 μm For EOT devices having gratings with high fill factors (>75%), lithography techniques capable of achieving critical dimensions below 300 nm may be needed. In such embodiments, contact photolithography techniques may be advanced to produce below 300 nm. For example, a photoresist pattern with a ~400 nm dimension may be produced using contact photolithography and a subsequent isotropic plasma etch.

FIGS. 7A through 7D are wavelength diagrams illustrating the output of exemplary EOT devices 100, consistent with certain disclosed embodiments. The diagrams of FIGS. 7A-7D illustrate reflection and transmission wavelengths corresponding to different exemplary embodiments of EOT devices 100, where each of the exemplary EOT devices 100 may have different configurations of EOT devices 110, including different combinations and configurations of EOT films 111, apertures 114, and optical cavity 115. The different combinations and configurations may include, for example, changes to the thickness $T_{OC}$ of optical cavity 115 using actuators 130.

Figure 7A:
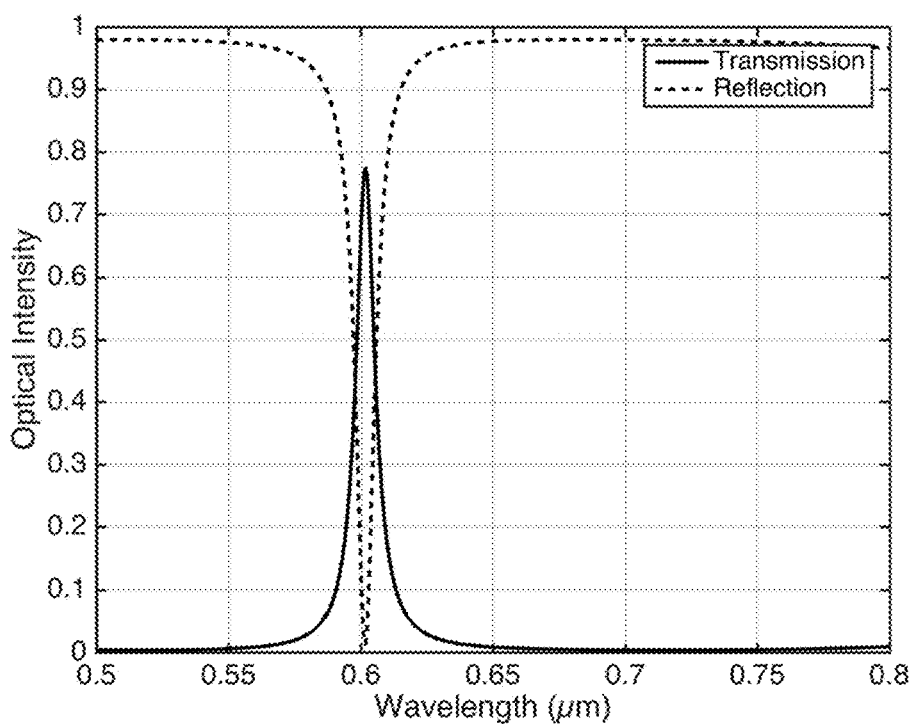
FIGS. 7A-7D are wavelength diagrams corresponding to exemplary tunable EOT filter devices having tunable EOT filters, according to certain disclosed embodiments.

FIG. 7A is a diagram illustrating filter transmission and reflection as a function of wavelength in the visible spectrum for an exemplary EOT filter device 100, consistent with certain embodiments. Generally, the visible spectrum may refer to wavelengths from about 0.4 to 0.7 μm. In some embodiments, the exemplary diagram of FIG. 7A may correspond to an EOT filter device 100 that includes EOT films 111a and 111b comprised of aluminum and having a thickness $T_{EOT}$ that may be greater than 20 nm and/or less than 200 nm (e.g., about 50 nm) and a metal fill factor of 0.5 to 0.95 (e.g., about 0.9) (from a top down view, 90% of the EOT film 111a and 111b constitutes metal and 10% constitutes apertures), and apertures 114 having a pitch P of 100 nm (or in the range of 20 to 300 nm). An EOT filter device 100 corresponding to FIG. 7A may have an optical cavity 115 comprised of $SiO2$ having a varied cavity thickness $T_{OC}$ between 100 nm and 800 nm (such as an average cavity thickness of about 600 nm. In FIG. 7A, the target wavelength may be 0.6 μm. Peak transmission is approximately 78%, and the full-width half-maximum (FWHM) value is approximately 0.01 μm. The refractive index of $SiO_2$ in the optical cavity 115 is approximately 1.46, and the (complex) refractive index of each of aluminum EOT films 111 is approximately 0.06+i*5.14. In the embodiment of FIG. 7A, EOT filter device 100 may filter to output different target wavelengths, for example, by having a varied thickness of the $SiO_2$ optical cavity, such as described with respect to FIGS. 4B and 4C. The embodiment of FIG. 7A may also filter light in the visible spectrum where the optical cavity 115 is comprised of air (comprising a refractive index of 1.000277) or a vacuum (refractive index of 1). In this case, the thickness of the optical cavity $T_{oc}$ may be dynamically adjusted between about 0.1 μm and 1.1 μm with piezoelectric actuators, such as described with herein.

Figure 7B:
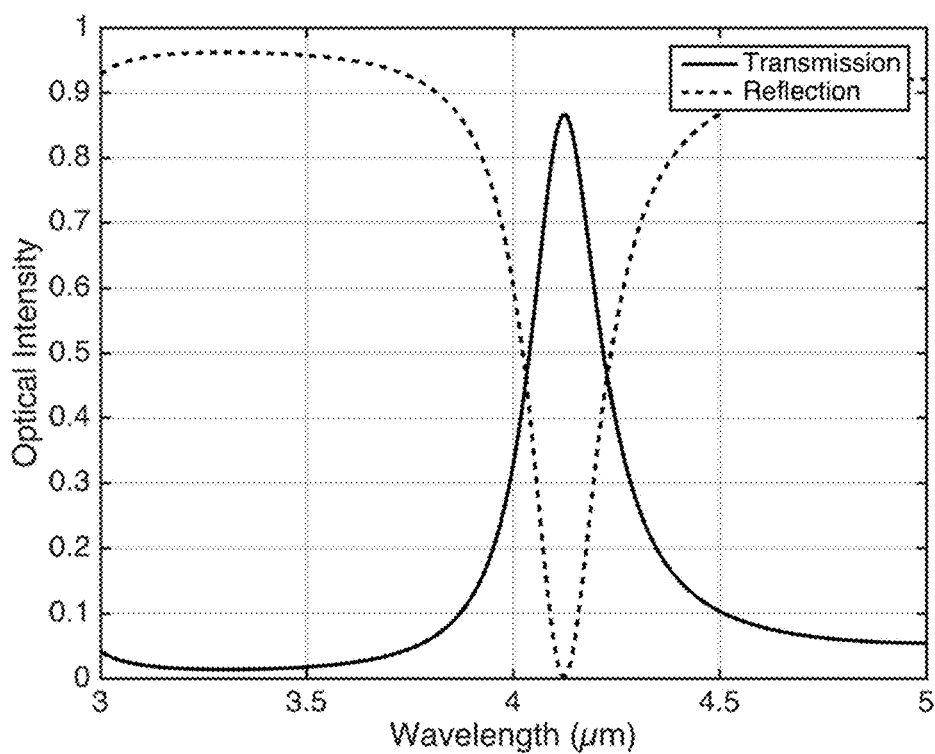

FIG. 7B is a diagram illustrating filter transmission and reflection as a function of wavelength in the short-wavelength infrared (SWIR) spectrum for an exemplary EOT filter device 100, consistent with certain embodiments. Generally, SWIR may refer to wavelengths from about 1 to 3 μm. In some embodiments, the exemplary diagram of FIG. 7B may correspond to an EOT filter device 100 that includes EOT films 111a and 111b comprised of silver and having a thickness $T_{EOT}$ that may be greater than 10 nm and/or may be less than 250 nm (e.g., about 100 nm) and a metal fill factor between 0.5 to 0.95 (e.g., about 0.8), and apertures 114 having a pitch P of 500 nm (or in the range of 200 to 1000 nm). An EOT filter device 100 corresponding to FIG. 7B may further include an optical cavity 115 comprised of SiO2 and having a varied cavity thickness between 0.1 μm and 2.5 μm (which may comprise an average cavity thickness $T_{OC}$ of 0.5 μm). In FIG. 7B, the target wavelength may be 1.4 μm. Peak transmission is approximately 85%, and the FWHM value is approximately 0.1 μm. The refractive index of optical cavity 115 is approximately 1.46, and the refractive index of each of EOT films 111 is approximately 0.5+i*13.3. In the embodiment of FIG. 7B, EOT filter device 100 may filter to output different target wavelengths, for example, by having a varied thickness of the optical cavity, such as described with respect to FIGS. 4B and 4C. The embodiment of FIG. 7B may also filter light in the SWIR spectrum where the optical cavity 115 is comprised of air (comprising a refractive index of 1.000277) or a vacuum (refractive index of 1). In this alternative, the thickness of the optical cavity Toc may be dynamically adjusted between about 0.4 μm and 4.6 μm with piezoelectric actuators, such as described with herein.

Figure 7C:
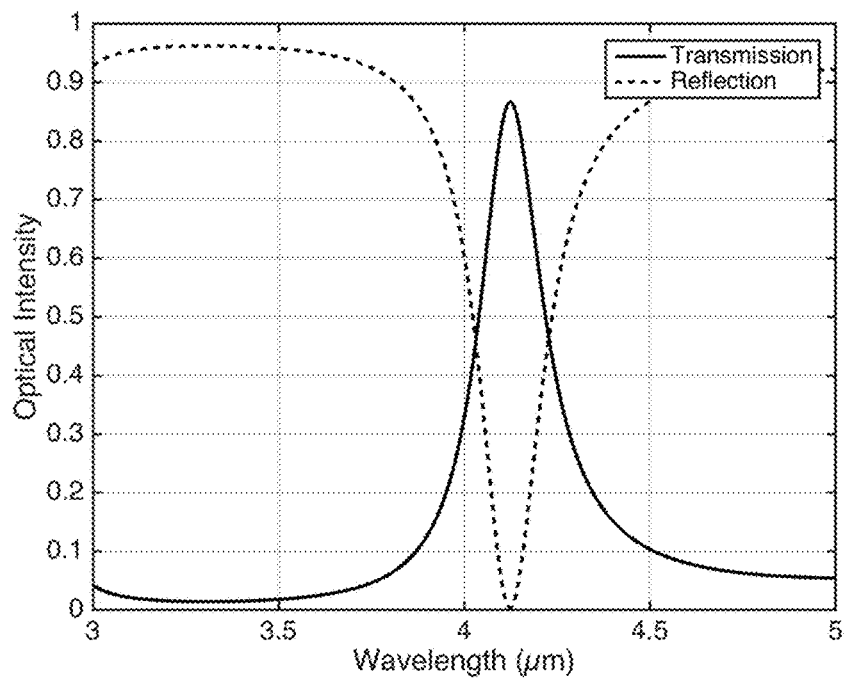

FIG. 7C is a diagram illustrating filter transmission and reflection as a function of wavelength in the mid-wavelength infrared (MWIR) spectrum for an exemplary EOT filter device 100, consistent with certain embodiments. Generally, MWIR may refer to wavelengths from about 3 to 5 μm. In some embodiments, the exemplary diagram of FIG. 7C may correspond to an EOT filter device 100 that includes EOT films 111a and 111b comprised of silver and having a thickness $T_{EOT}$ that may be greater than 5 nm and/or may be less than 1000 nm (such as about 200 nm) and a metal fill factor of 0.5 to 0.95 (e.g., about 0.9), and apertures 114 having a pitch P of 500 nm. An EOT filter device 100 corresponding to FIG. 7C may further include an optical cavity 115 comprised of SiO2 and having a varied cavity thickness $T_{OC}$ between 0.1 μm and 4.0 μm (e.g., about 3.0 μm). In FIG. 7C, the target wavelength may be 4.1 μm. Peak transmission is approximately 87%, and the FWHM value is approximately 0.2 μm. The refractive index of optical cavity 115 is approximately 1.46, and the refractive index of each of EOT films 111 is approximately 2.0+i*26.5. In the embodiment of FIG. 7C, EOT filter device 100 may filter to output different target wavelengths, for example, by having a varied thickness of the SiO$_2$ cavity, such as described with respect to FIGS. 4B and 4C. The embodiment of FIG. 7C may also filter light in the MWIR spectrum where the optical cavity 115 is comprised of air (comprising a refractive index of 1.000277) or a vacuum (refractive index of 1). In this case, the thickness of the optical cavity Toc may be dynamically adjusted between about 0.1 μm and 5.5 μm with piezoelectric actuators, such as described with herein.

Figure 7D:
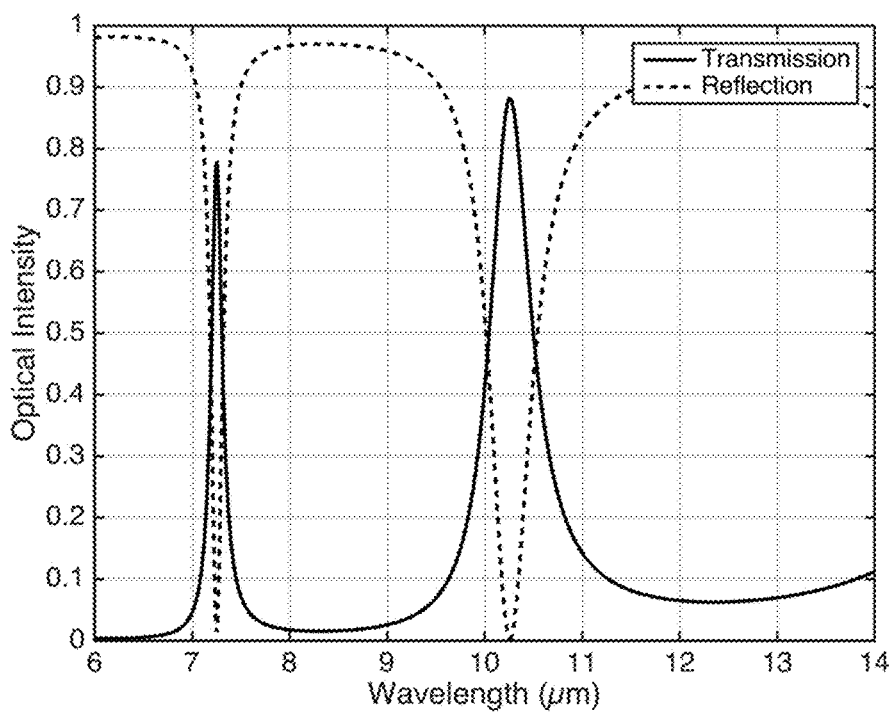

FIG. 7D is a diagram illustrating filter transmission and reflection as a function of wavelength in the long-wavelength infrared (LWIR) spectrum for an exemplary EOT filter 100, consistent with certain embodiments. Generally, LWIR may refer to wavelengths from about 8 to 12 μm. In some embodiments, the exemplary diagram of FIG. 7D may correspond to an EOT filter device 100 that includes EOT films 111a and 111b comprised of aluminum and having a thickness $T_{EOT}$ that may be greater than 10 nm and/or may be less than 2000 nm (e.g., about 200 nm) and a metal fill factor between 0.5 to 0.95 (e.g., about 0.85), and apertures 114 having a pitch P of 2 μm (or in the range of 0.1 to 4 μm). An EOT filter device 100 corresponding to FIG. 7D may further include an optical cavity 115 comprised of ZnSe and having a varied cavity thickness between 0.2 μm and 7.0 μm (which may comprise an average cavity thickness $T_{OC}$ of 4.75 μm). In FIG. 7D, the target wavelength may be 10.3 μm. Peak transmission is approximately 88%, and the FWHM value is approximately 0.5 μm. The refractive index of optical cavity 115 is approximately 2.4, and the refractive indices of EOT films 111 are approximately 15.2+i*83.1. In the embodiment of FIG. 7D, EOT filter device 100 may filter to output different target wavelengths, for example, by having a varied thickness of the optical cavity, such as described with respect to FIGS. 4B and 4C. The embodiment of FIG. 7D may also filter light in the LWIR spectrum where the optical cavity 115 is comprised of air (comprising a refractive index of 1.000277) or a vacuum (refractive index of 1). In this alternative, the thickness of the optical cavity Toc may be dynamically adjusted between about 0.3 μm and 15.0 μm with piezoelectric actuators, such as described with herein.

While FIGS. 7A through 7D illustrate embodiments in the visible, SWIR, MWIR, and LWIR spectrums, respectively, the disclosed concepts may be applicable to other spectrums or wavelength ranges as well. In addition, while FIGS. 7A through 7D have been described with respect to an optical cavity having a varied thickness or a variable thickness, other embodiments contemplate these and similar embodiments having a fixed uniform thickness. For example, the fixed uniform thickness may be within the ranges noted above with respect to FIGS. 7A to 7D to have the filter output a target wavelength.

Figure 8A:
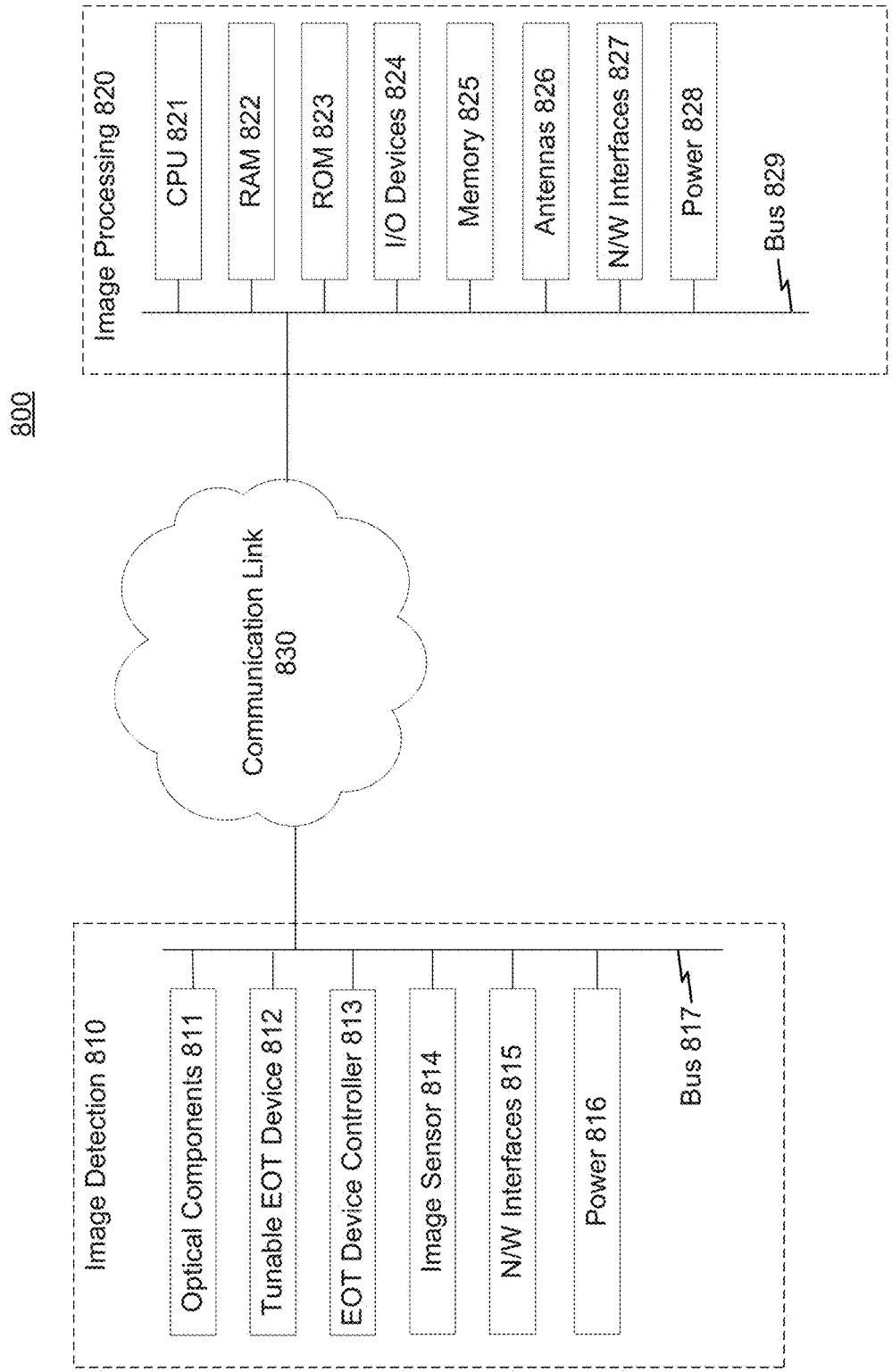
FIG. 8A is a block diagram illustrating an exemplary imaging system including an EOT filter device with an EOT filter, according to certain disclosed embodiments.

FIG. 8A is a block diagram illustrating an exemplary imaging system including a tunable EOT device, such as tunable EOT filter device 100, consistent with certain disclosed embodiments. It should be readily apparent that the example imaging system 800 depicted in FIG. 8A represents a generalized schematic illustration and that other components/devices can be added, removed, or modified. As shown in FIG. 8A, an example imaging system 800 may include an image detection system 810, an image processing system 820, and communication link 830.

Image detection system 810 may be any type of device and/or component configured to detect, capture, and transmit information corresponding to an object of interest, many of which are known in the art. As illustrated in FIG. 8A, image detection system 810 may include optical components 811, tunable EOT device 812, EOT device controller 813, image sensor 814, network interfaces 815, power 816, and bus 817.

Optical components 811 may include one or more components that capture the light from an object and bring it to a focus for transmission through tunable EOT device 812 and image sensor 814. Optical components 811 may be, for example, optical lenses or assembly of optical lenses and/or mirrors. As will be understood by one of skill in the art, optical components 811 may have different focal lengths, apertures, and other properties.

Tunable EOT device 812 may include any of the embodiments disclosed herein, including, for example, tunable EOT filter device 100 comprised of EOT filters 110 having EOT films 111, apertures 114, and optical cavity 115, and optical windows 120 and actuators 130. EOT filter controller 813 may be any device or component that allows for the dynamic setting or tuning of tunable EOT device 812. For example, EOT filter controller 813 may control piezo-electric actuation and/or application of voltages to the optical cavity material to change optical path length of the optical cavity 115 (e.g., by changing the distance between EOT films 111 and thus the thickness of the optical cavity 115, and/or changing the dielectric constant of the material of the optical cavity 115). EOT filter controller 813 may itself be controlled by, or receive commands and instructions from, image processing system 820.

Image sensor 814 may include one or more components that detect and convey information that corresponds to or constitutes an image of an object. For example, image sensor 814 may receive and capture light information from tunable EOT filter device 812, and the light information may correspond to, or constitute, an image of an object. Image sensor 814 may be analog and/or digital. Image sensor 814 may include, for example, charge-coupled devices (CCD) or active pixel sensors in integrated circuit (IC) devices, such as, for example, N-type metal-oxide-semiconductor (MOS) devices, complementary MOS (CMOS) devices, etc.

In addition, image detection system 810 can include network interfaces 815 that provide wireless and/or wire line digital and/or analog interface to one or more networks, such as communication link 830, over one or more network connections (not shown), a power source 816 that provides an appropriate alternating current (AC) or direct current (DC) to power one or more components of image processing system 810, and a bus 817 that allows communication among the various disclosed components of image detection system 810 of FIG. 8A. Each of these components is well-known in the art and will not be discussed further. Although not illustrated, image detection system 810 may also include other components, such as, for example, collimators, focusing mechanisms, other filtering components, etc.

Image detection system 810 can be, by way of example and not limitation, still cameras, video cameras, telescopes, microscopes, medical imaging equipment, night vision equipment, radar, sonar, etc. Although not shown, image detection system 810 may include a shutter mechanism to control the amount of time that light is allowed to enter the image detection system 810, etc.

Image processing system 820 may include one or more of the following components: at least one central processing unit (CPU) 821 configured to execute computer program instructions to perform various processes and methods, random access memory (RAM) 822 and read only memory (ROM) 823 configured to access and store data and information and computer program instructions, I/O devices 824 configured to provide input and/or output to image processing system 820 (e.g., keyboard, mouse, display, speakers, printers, modems, network cards, etc.), and storage media 825 or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium), where the files that comprise an operating system, application programs including, for example, web browser application, email application and/or other applications, and data files are stored.

In addition, image processing system 820 can include antennas 826, network interfaces 827 that provide wireless and/or wire line digital and/or analog interface to one or more networks, such as communication link 830, over one or more network connections (not shown), a power source 828 that provides an appropriate alternating current (AC) or direct current (DC) to power one or more components of image processing system 820, and a bus 829 that allows communication among the various disclosed components of image processing system 820 of FIG. 8A. Each of these components is well-known in the art and will not be discussed further.

Communication link 830 may allow communication between or among one or more computing systems and/or devices, such as, for example, image detection system 810 and image processing system 820. Communication link 830 may be wired, wireless, or any combination thereof. Communication link 830 may be a network such as, for example, the Internet, a local area network, a wide area network, a WiFi network, a workstation peer-to-peer network, a direct link network, a Bluetooth connection, a bus, or any other suitable communication network or any combination thereof.

Although not shown, imaging system 800 can include one or more mechanisms and/or devices by which imaging system 800 can perform the methods as described herein. For example, imaging system 800 can include one or more encoders and/or decoders, one or more interleavers, one or more circular buffers, one or more multiplexers and/or de-multiplexers, one or more permuters and/or depermuters, one or more encryption and/or decryption units, one or more modulation and/or demodulation units, one or more arithmetic logic units and/or their constituent parts, etc. These mechanisms and/or devices can include any combination of hardware and/or software components and can be included, in whole or in part, in any of the components shown in FIG. 8A.

In one or more exemplary designs of imaging system 800 of FIG. 8A, the functions described can be implemented in hardware, software, firmware, or any combination thereof. If implemented in software, the functions can be stored as one or more instructions or code on computer-readable medium, including the computer-readable medium described above.

In FIG. 8A, imaging system 800 may use optical components 812 to capture and focus light corresponding to an object of interest. Imaging system 800 may pass the captured light to exemplary EOT filter device 100, which may filter and enhance wavelengths of interest. The wavelengths of interest may be determined based on the configuration, shape, size, and materials that form EOT filter device 100. The filtered and enhanced wavelengths of interest may then be transmitted to and detected by image sensor 815. Imaging system 800 may pass the image captured by image detection system 810 to image processing system 820 for subsequent processing and output.

Figure 8B:
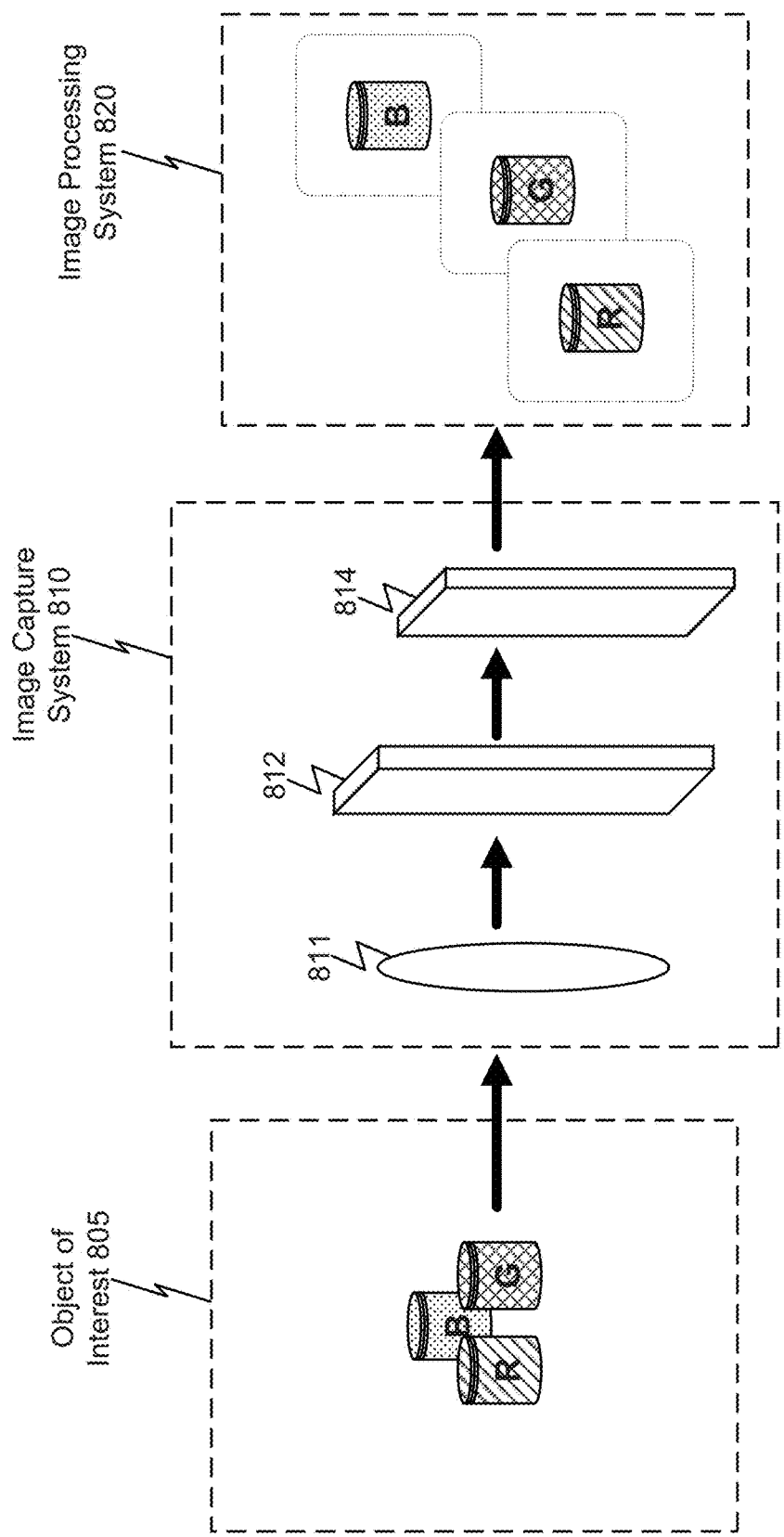
FIGS. 8B and 8C are diagrams illustrating exemplary application of a tunable EOT filter device having an EOT filter, according to certain disclosed embodiments.
Figure 8C:
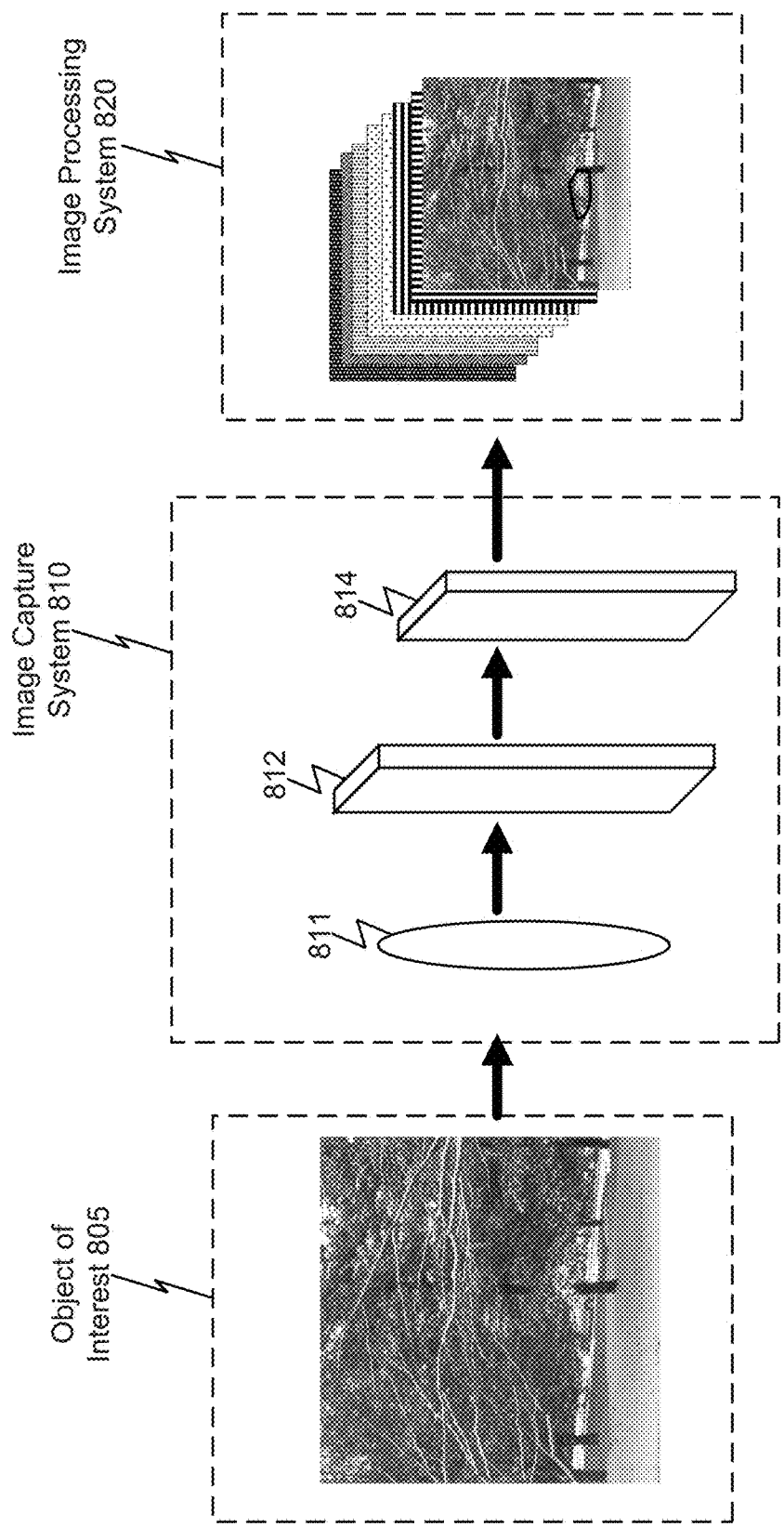

FIGS. 8B-8C illustrate exemplary application and processing in imaging system 800 of FIG. 8A that includes a tunable EOT device, such as tunable EOT filter device 100 and/or including the EOT filter 110, consistent with the disclosed embodiments. In FIGS. 8B and 8C, a tunable EOT filter device 100 may be used in a hyperspectral imaging system to select and capture optical wavelengths of interest.

As illustrated in FIGS. 8B and 8C, when imaging system 800 captures a scene or object 805, image capture system 810 may dissect each 2D scene at separate wavelengths, and the image processing system may use the data captured by image capture system 810 to form a 3D data cube. The object of interest 805 may be processed through optical components 811, EOT device 812, and image sensor 814. EOT filter device 812 may allow imaging system 800 to capture images as the wavelength or frequency of light transmitted by the filter is dynamically altered as the images are captured. Information corresponding to the object of interest 805 may be transmitted to image processing system 820, where the information may be processed and output for display and/or analysis. For example, as illustrated in exemplary FIG. 8B, image processing system 820 may produce a collection of images, called an image data cube, and the collection of images may contain a point-by-point optical spectrum of the scene. For example, each "point" in an image, or each pixel in an imaging sensor, receives not just one value representing the entire spectrum of light, but many values where each value corresponds to a specific wavelength in the imaged spectrum. An image may be produced such that each point in the image contains the data to produce a graph of intensity versus wavelength at that point. Using the enhanced spectral information, this point-by-point spectral interrogation of a scene or sample may improve the ability for positive detection of critical materials, contents, or structures.

The spectral region for imaging using the disclosed embodiments may be defined by a particular application. For example, long wave infrared (LWIR) imaging can be used for standoff detection and identification of gaseous materials; visible (VIS) imaging can be used in medical imaging to identify malignant tissue; and ultraviolet (UV) imaging can be used to provide post-disaster assessments or atmospheric study of the earth's ozone. The disclosed embodiments may realize minimized size, weight, and power consumption to allow for extended duration, range, altitude, and increased payload.

In the embodiments illustrated in FIGS. 8A through 8C, because exemplary EOT filter device 100 may be tunable, the performance of the imaging system 800 may be improved while its size, weight, and power consumption may be reduced. For example, the exemplary EOT filter device 100 may allow for improved narrowband transmission, discarding noise outside the frequency of interest to produce a higher signal-to-noise ratio (SNR). FIGS. 8B and 8C illustrate that, with increased spectral information, an object that might otherwise blend in with its surroundings using broadband detecting systems can be filtered out against the background to detect particle objects of interest. The disclosed embodiments may allow for optimized transmission and spectral resolution while minimizing size, weight, and power consumption of tunable EOT devices. Additionally, the disclosed concepts may result in narrowband, high transmission, and low SWP filters with angular performance and manufacturability that allows for integration into hyperspectral imaging systems.

The foregoing description, along with its associated embodiments, has been presented for purposes of illustration only. It is not exhaustive and does not limit the invention to the precise form disclosed. Those skilled in the art will appreciate from the foregoing description that modifications and variations are possible in light of the above teachings or may be acquired from practicing the disclosed embodiments. For example, the steps described need not be performed in the same sequence discussed or with the same degree of separation. Likewise various steps may be omitted, repeated, or combined, as necessary, to achieve the same or similar objectives. Accordingly, the invention is not limited to the above-described embodiments, but instead is defined by the appended claims in light of their full scope of equivalents.

What is claimed is:

1. An extraordinary optical transmission (EOT) image capture system comprising:
   one or more lenses configured to capture light corresponding to an object;
   an EOT filter device configured to receive the light captured by the one or more lenses, the EOT filter device comprising:
      a first EOT film having a first EOT film thickness $T_{EOT1}$, the first EOT film including:
         a first upper surface,
         a first lower surface, and
         a plurality of first apertures having a first pitch $P_1$ and a first aperture width;
      a second EOT film having a second EOT film thickness $T_{EOT2}$, the second EOT film including:
         a second upper surface,
         a second lower surface, and
         a plurality of second apertures having a second pitch $P_2$ and a second aperture width; and
      an optical cavity disposed between the first EOT film and the second EOT film, the optical cavity having a thickness $T_{OC}$, which is measured from the first lower surface to the second upper surface,
      wherein the EOT filter device uses surface plasmon resonance to allow wavelengths of interest to pass through based on the first EOT film thickness $T_{EOT1}$, the second EOT film thickness $T_{EOT2}$, the first pitch $P_1$, the second pitch $P_2$, the first aperture width, and the second aperture width; and
   an image sensor configured to capture an image corresponding to the object based on the wavelengths of interest received from the EOT filter device,
   wherein the optical cavity is configured to cause destructive interference of a first portion of the light transmitted through the first EOT film, the first portion of the light having a first frequency bandwidth, so that only a part of the first portion of the light is transmitted through the second EOT film, the part of the first portion of the light transmitted through the second EOT film having a second frequency bandwidth within and less than the first frequency bandwidth.

2. The EOT filter device of claim 1, the optical cavity further having a refractive index $RI_{OC}$, wherein an optical path length of light through the optical cavity is a function of the optical cavity thickness $T_{OC}$ and the refractive index $RI_{OC}$.

3. The EOT filter device of claim 2, further comprising:
   a plurality of actuators, wherein the plurality of actuators are configured to change the wavelengths of interest by changing the optical path length of the light.

4. The EOT filter device of claim 3, wherein the plurality of actuators change the wavelengths of interest by changing the optical cavity thickness $T_{OC}$.

5. The EOT filter device of claim 4, wherein the optical cavity thickness $T_{OC}$ is measured from the first lower surface to the second upper surface.

6. The EOT image capture system of claim 1, further comprising:
   a first buffer layer formed between the first EOT film and the optical cavity; and
   a second buffer layer formed between the second EOT film and the optical cavity.

7. The EOT image capture system of claim 6, wherein the first EOT film and the second EOT film are comprised of a semiconductor.

8. The EOT image capture system of claim 1, wherein the first EOT film and the second EOT film are comprised of a metal.

9. The EOT image capture system of claim 1, wherein the first EOT film is configured to transmit via extraordinary optical transmission a portion of the light received from the one or more lenses that falls within a first frequency bandwidth and substantially prevent transmission of a second portion of the light received from the one or more lenses that falls outside the first frequency bandwidth.

10. The EOT image capture system of claim 1, wherein the wavelengths of interest comprise a first wavelength of interest, where each of the plurality of apertures have a width smaller than the first wavelength, and wherein the thickness $T_{OC}$ of the optical cavity is an integer multiple of one half of the first wavelength of interest within the optical cavity.

11. The EOT image capture system of claim 10, wherein the first pitch $P_1$ is less than the first wavelength of interest.

12. The EOT image capture system of claim 10, wherein the second pitch $P_2$ is less than the first wavelength of interest.

13. The EOT image capture system of claim 1, wherein the wavelengths of interest comprise a first wavelength of interest and the optical cavity is configured to cause constructive interference of light having the first wavelength of interest.

14. An extraordinary optical transmission (EOT) imaging system comprising:
one or more lenses;
an EOT filter device configured to receive light from the one or more lenses, the EOT filter device comprising:
 a first EOT film having a first EOT film thickness $T_{EOT1}$, the first EOT film including:
  a first upper surface,
  a first lower surface, and
  a plurality of first apertures having a first aperture width smaller than wavelengths of the light received from the one or more lenses, the first apertures spaced at a first pitch $P_1$ such that the first EOT film is configured to transmit via extraordinary optical transmission a first portion of the light received from the one or more lenses that falls within a first frequency bandwidth and substantially prevent transmission of a second portion of the light received from the one or more lenses that falls outside the first frequency bandwidth;
 a second EOT film having a second EOT film thickness $T_{EOT2}$, the second EOT film including:
  a second upper surface,
  a second lower surface, and
  a plurality of second apertures having a second aperture width smaller than the wavelengths of the light received from the one or more lenses, the second apertures spaced at a second pitch $P_2$, and
 wherein the first and second EOT films form an optical cavity having a thickness $T_{OC}$, which is measured from the first lower surface to the second upper surface, and a refractive index $RI_{OC}$, wherein an optical path length of light through the optical cavity is a function of the optical cavity thickness $T_{OC}$ and the refractive index $RI_{OC}$,
 wherein the optical cavity is configured to cause destructive interference of the first portion of the light transmitted through the first EOT film so that only a part of the first portion of the light is transmitted through the second EOT film, the part of the first portion of the light transmitted through the second EOT film having a second frequency bandwidth within and less than the first frequency bandwidth; and
an image sensor configured to receive and sense the part of the first portion of the light transmitted through the second EOT film to capture an image corresponding to the light received from the one or more lenses.

15. The EOT imaging system of claim 14, wherein the first frequency bandwidth and the second frequency bandwidth comprises a first targeted frequency associated with a first targeted wavelength of light, where each of the plurality of apertures have a width smaller than the first targeted wavelength, and wherein the thickness $T_{OC}$ of the optical cavity is an integer multiple of one half of the first targeted wavelength the light within the optical cavity.

16. The EOT imaging system of claim 15, wherein the first pitch $P_1$ is less than the first targeted wavelength.

17. The EOT imaging system of claim 14, wherein the optical cavity is configured to cause constructive interference of light having a first frequency within the second frequency bandwidth.

18. An extraordinary optical transmission (EOT) image capture system comprising:
optical components configured to capture wavelengths of light corresponding to an object;
an EOT filter device configured to receive the light captured by the optical components and transmit wavelengths of interest, the EOT filter device comprising:
 a first EOT film having a first EOT film thickness $T_{EOT1}$ and including a plurality of first apertures having a first pitch $P_1$;
 a second EOT film having a second EOT film thickness $T_{EOT2}$ and including a plurality of second apertures having a second pitch $P_2$; and
 an optical cavity disposed between the first EOT film and the second EOT film, the optical cavity having a thickness $T_{OC}$ and a refractive index $RI_{OC}$, wherein an optical path length of light through the optical cavity is a function of the optical cavity thickness $T_{OC}$ and the refractive index $RI_{OC}$,
 wherein the EOT filter device is configured to transmit the wavelengths of interest based on the first EOT film thickness $T_{EOT1}$, the second EOT film thickness $T_{EOT2}$, the first pitch $P_1$, the second pitch $P_2$, and the optical cavity thickness $T_{OC}$; and
an image sensor configured to receive the wavelengths of interest from the EOT filter device and capture an image corresponding to the object,
wherein the first EOT film is configured to transmit via extraordinary optical transmission a first portion of the light received from the optical components that falls within a first frequency bandwidth and substantially prevent transmission of a second portion of the light received from the optical components that falls outside the first frequency bandwidth, and
wherein the optical cavity is configured to cause destructive interference of the first portion of the light transmitted through the first EOT film so that only a part of the first portion of the light is transmitted through the second EOT film, and the part of the first portion of light transmitted through the second EOT film has a frequency bandwidth within and less than the first frequency bandwidth.

19. The EOT image capture system of claim 18, wherein the plurality of first apertures have a first aperture width, and the first pitch $P_1$ and the first aperture width are smaller than the wavelengths of the light received from the optical components.

20. The EOT image capture system of claim 18, wherein the image sensor is further configured to receive and sense the part of the first portion of light transmitted through the second EOT film to capture an image corresponding to the object.

21. The EOT image capture system of claim 18, wherein the first EOT film further comprises a first upper surface and a first lower surface, the second EOT film further comprises a second upper surface and a second lower surface, and the optical cavity thickness $T_{OC}$ is measured from the first lower surface to the second upper surface.

22. The EOT image capture system of claim 18, further comprising:
   a first buffer layer formed between the first EOT film and the optical cavity; and
   a second buffer layer formed between the second EOT film and the optical cavity.

23. The EOT image capture system of claim 22, wherein the first EOT film and the second EOT film are comprised of a semiconductor.

24. The EOT image capture system of claim 18, wherein the first EOT film and the second EOT film are comprised of a metal.

25. The EOT image capture system of claim 18, wherein the optical components include one or more lenses.

26. The EOT image capture system of claim 18,
   wherein the wavelengths of interest comprise a first wavelength of interest,
   where each of the plurality of apertures have a width smaller than the first wavelength of interest, and
   wherein the thickness $T_{OC}$ of the optical cavity is an integer multiple of one half of the first wavelength of interest within the optical cavity.

27. The EOT image capture system of claim 26, wherein the first pitch $P_1$ is less than the first wavelength of interest.

28. The EOT image capture system of claim 26, wherein the second pitch $P_2$ is less than the first wavelength of interest.

29. The EOT image capture system of claim 18, wherein the wavelengths of interest comprise a first wavelength of interest and the optical cavity is configured to cause constructive interference of light having the first wavelength of interest.

* * * * *